US012674070B2

(12) United States Patent
Kim

(10) Patent No.: US 12,674,070 B2
(45) Date of Patent: Jul. 7, 2026

(54) INK COMPOSITION AND ELECTRONIC APPARATUS INCLUDING FILM PREPARED USING INK COMPOSITION

(71) Applicant: SAMSUNG DISPLAY CO., LTD., Yongin-si (KR)

(72) Inventor: Joonhyung Kim, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 456 days.

(21) Appl. No.: 18/204,865

(22) Filed: Jun. 1, 2023

(65) Prior Publication Data

US 2024/0059920 A1 Feb. 22, 2024

(30) Foreign Application Priority Data

Aug. 12, 2022 (KR) ........................ 10-2022-0101580

(51) Int. Cl.

| | |
|---|---|
| ***C09D 11/50*** | (2014.01) |
| ***C09D 11/037*** | (2014.01) |
| ***C09D 11/101*** | (2014.01) |
| ***C09D 11/102*** | (2014.01) |
| ***C09K 11/02*** | (2006.01) |
| ***C09K 11/08*** | (2006.01) |
| ***C09K 11/88*** | (2006.01) |

(Continued)

(52) U.S. Cl.

CPC ............ *C09D 11/50* (2013.01); *C09D 11/037* (2013.01); *C09D 11/101* (2013.01); *C09D 11/102* (2013.01); *C09K 11/025* (2013.01); *C09K 11/0883* (2013.01); *C09K 11/883* (2013.01); *H10K 50/115* (2023.02); *B82Y 20/00* (2013.01); *B82Y 40/00* (2013.01)

(58) Field of Classification Search

CPC ........ C09D 11/50; C09K 11/02; C09K 11/025

See application file for complete search history.

(56) References Cited

U.S. PATENT DOCUMENTS

| | | | |
|---|---|---|---|
| 7,982,812 | B2 | 7/2011 | Rho et al. |
| 9,534,085 | B2 | 1/2017 | Toda et al. |

(Continued)

FOREIGN PATENT DOCUMENTS

| | | | |
|---|---|---|---|
| CN | 111320898 | A | 6/2020 |
| CN | 111320981 | A | 6/2020 |

(Continued)

OTHER PUBLICATIONS

Marco Sangermano et al; "Interpenetrated hybrid thiol-ene/epoxy UV-cured network withenhanced impact resistance" Prog. Org. Coat. 2015, 78, 244-248.

(Continued)

*Primary Examiner* — Matthew E. Hoban

(74) *Attorney, Agent, or Firm* — CANTOR COLBURN LLP

(57) ABSTRACT

An ink composition includes: a quantum dot containing at least one organic ligand on a surface thereof; a first monomer containing at least one epoxy group; a second monomer containing at least one oxetane group; a third monomer containing at least one thiol group; and a tertiary amine compound containing at least one allylamine group, where the organic ligand may contain at least one polar moiety. Also, an electronic apparatus including a film prepared from the ink composition is provided.

13 Claims, 4 Drawing Sheets

(51) Int. Cl.
*H10K 50/115* (2023.01)
*B82Y 20/00* (2011.01)
*B82Y 40/00* (2011.01)

(56) References Cited

U.S. PATENT DOCUMENTS

| | | | |
|---|---|---|---|
| 10,519,366 | B2 | 12/2019 | Qiu et al. |
| 10,670,962 | B2 | 6/2020 | Park et al. |
| 10,689,511 | B2 | 6/2020 | Ahn et al. |
| 11,267,980 | B2 | 3/2022 | Tangirala et al. |
| 11,618,833 | B2 | 4/2023 | Yoshihara et al. |
| 2007/0043205 | A1 | 2/2007 | Dias et al. |
| 2017/0176854 | A1 | 6/2017 | Park et al. |
| 2018/0282617 | A1 | 10/2018 | Qiu et al. |
| 2019/0390076 | A1 | 12/2019 | Isonaka et al. |
| 2020/0201124 | A1 | 6/2020 | Lee et al. |
| 2020/0224047 | A1 | 7/2020 | Yoshihara et al. |
| 2020/0231871 | A1 | 7/2020 | Kim et al. |
| 2020/0347254 | A1 | 11/2020 | Tangirala et al. |
| 2021/0024819 | A1 | 1/2021 | Kang et al. |
| 2021/0206922 | A1 | 7/2021 | Onishi |
| 2021/0261806 | A1 | 8/2021 | Kim et al. |
| 2022/0073817 | A1* | 3/2022 | Liao ........................ C09K 11/70 |
| 2022/0213380 | A1 | 7/2022 | Kang et al. |
| 2022/0389308 | A1* | 12/2022 | Liao ..................... C09K 11/703 |
| 2022/0411692 | A1* | 12/2022 | Ishii ......................... C08K 3/00 |
| 2023/0098571 | A1 | 3/2023 | Kim |

FOREIGN PATENT DOCUMENTS

| | | | |
|---|---|---|---|
| JP | 2021054918 | A | 4/2021 |
| KR | 1020060012294 | A | 2/2006 |
| KR | 1020070094679 | A | 9/2007 |
| KR | 1020090036373 | A | 4/2009 |
| KR | 1020120002946 | A | 1/2012 |
| KR | 1020150133795 | A | 11/2015 |
| KR | 1020160028276 | A | 3/2016 |
| KR | 1020170086566 | A | 7/2017 |
| KR | 1020170137882 | A | 12/2017 |
| KR | 1020180081002 | A | 7/2018 |
| KR | 1020180092671 | A | 8/2018 |
| KR | 1020180097145 | A | 8/2018 |
| KR | 1020210048934 | A | 5/2019 |
| KR | 20190098150 | A | 8/2019 |
| KR | 1020190112630 | A | 10/2019 |
| KR | 20200030542 | A | 3/2020 |
| KR | 20200074185 | A | 6/2020 |
| KR | 1020200076770 | A | 6/2020 |
| KR | 1020200090493 | A | 7/2020 |
| KR | 1020200112624 | A | 10/2020 |
| KR | 1020200140350 | A | 12/2020 |
| KR | 20210011227 | A | 2/2021 |
| KR | 1020210012828 | A | 2/2021 |
| KR | 1020210030787 | A | 3/2021 |
| KR | 1020210044043 | A | 4/2021 |
| KR | 1020210109112 | A | 9/2021 |
| KR | 20210154588 | A | 12/2021 |
| KR | 1020230041155 | A | 3/2023 |
| WO | 2018123103 | A1 | 7/2018 |

OTHER PUBLICATIONS

Ujala Farooq et al; "Toughening of Epoxy Systems with Interpenetrating Polymer Network (IPN): A Review"; Polymers 2020, 12, 1908; pp. 1-29.

International Search Report issued Nov. 8, 2023 in PCT Application No. PCT/KR2023/011613, 3 pages.

* cited by examiner

INK COMPOSITION AND ELECTRONIC APPARATUS INCLUDING FILM PREPARED USING INK COMPOSITION

This application claims priority to Korean Patent Application No. 10-2022-0101580, filed on Aug. 12, 2022, and all the benefits accruing therefrom under 35 U.S.C. § 119, the content of which in its entirety is herein incorporated by reference.

BACKGROUND

1. Field

One or more embodiments relate to an ink composition and an electronic apparatus including a film prepared using the ink composition.

2. Description of the Related Art

A light-emitting devices is a device that converts electrical energy into light energy. Examples of such a light-emitting device include organic light-emitting devices using organic materials for an emission layer, quantum dot light-emitting devices using quantum dots for an emission layer, and the like. The light-emitting device may be included in various electronic apparatuses, and may be included in, for example, an electronic apparatus such as a display apparatus.

As a method of realizing color in a display apparatus, it is proposed to use a color conversion layer including a color conversion light-emitting material that absorbs light of a specific wavelength and converts the light into light of another wavelength and emits the light, thereby further increasing color purity of red (R), green (G), and blue (B).

The color conversion layer may be formed by using an inkjet printing method. Accordingly, there is a demand for a material suitable for use in an inkjet printing method.

SUMMARY

One or more embodiments include an ink composition for forming a quantum dot film having no damage due to bending and having a low degree of visibility of a folded part, and a quantum dot film formed using the ink composition, and an electronic apparatus including the quantum dot film.

Additional aspects will be set forth in part in the description which follows and, in part, will be apparent from the description, or may be learned by practice of the presented embodiments of the disclosure.

According to one or more embodiments, an ink composition includes: a quantum dot containing at least one organic ligand on a surface, a first monomer containing at least one epoxy group, a second monomer containing at least one oxetane group, a third monomer containing at least one thiol group, and a tertiary amine compound containing at least one allylamine group, where the organic ligand may contain at least one polar moiety.

The third monomer may include a compound having a plurality of thiol groups.

According to an embodiment, the third monomer may include a compound containing one thiol group and a compound containing a plurality of thiol groups.

According to an embodiment, the third monomer may be represented by Formula 3-1 or Formula 3-2:

Formula 3-1

$$HS{-}\!\left(L_{31}\right)_{a31}\!{-}SH,$$

Formula 3-2

$$[R_{31}{-}\left[\left(L_{32}\right)_{a32}\right]_{n32}{-}A_{32}{-}\left[\left(L_{33}\right)_{a33}{-}SH\right]_{n33},$$

In Formulae 3-1 and 3-2, $L_{31}$ may be a linear or branched $C_1$-$C_{20}$ alkane group, a linear or branched $C_1$-$C_{20}$ alkene group, or a $C_6$-$C_{20}$ arene group, $L_{32}$ and $L_{33}$ may each be a single bond,

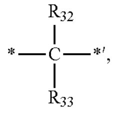

*—O—*', or

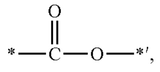

$A_{32}$ may be

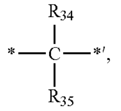

*—S—*', a $C_3$-$C_{20}$ heteroarene group, or

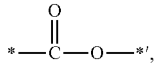

a31 to a33 may each independently be 1, 2, 3, 4, 5, 6, 7, 8, 9, or 10, $R_{31}$ to $R_{35}$ may each independently be hydrogen, deuterium, a halogen element, or a linear, branched, or cyclic $C_1$-$C_{20}$ alkyl group, n32 and n33 may each independently be 0, 1, 2, 3, 4, or 5, the sum of n32 and n33 may be 1 or greater, and

* and *' each indicate a binding site to an adjacent atom.

The tertiary amine compound may include a compound containing a plurality of allylamine groups.

According to an embodiment, the tertiary amine compound may include a compound containing one allylamine group and a compound containing a plurality of allyl groups.

The tertiary amine compound may be represented by Formula 4-1 or Formula 4-2:

Formula 4-1

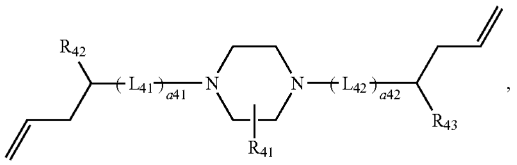

Formula 4-2

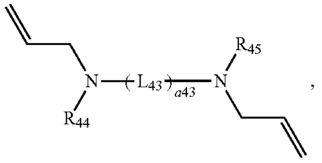

In Formulae 4-1 and 4-2, $L_{41}$, $L_{42}$, and $L_{43}$ may each independently be a direct bond,

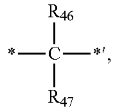 or 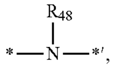

a41 and a42 may each independently be 0, 1, 2, 3, 4, or 5, a43 may be 1, 2, 3, 4, or 5, $R_{41}$ to $R_{48}$ may each independently be hydrogen, deuterium, halogen element, $—CH_2—CH═CH_2$, or a substituted or unsubstituted linear, branched, or cyclic $C_1$-$C_{20}$ alkyl group, a substituent of the linear, branched, or cyclic $C_1$-$C_{20}$ alkyl group may include deuterium, a halogen element, or $—N(CH_2—CH═CH_2)_2$, and

* and *' each indicate a binding site to an adjacent atom.

The quantum dot may include a group II-VI semiconductor compound, a group III-V semiconductor compound, a group III-VI semiconductor compound, a group semiconductor compound, a group IV-VI semiconductor compound, a group IV element or compound, or a combination thereof.

According to an embodiment, the quantum dot may have a core-shell structure.

According to an embodiment, the at least one polar moiety of the organic ligand may include an alkylpolyol structure.

The ink composition may further include a photopolymerization initiator.

The ink composition may have a viscosity in a range of about 20 centipoise (cP) to about 80 cP at a temperature of 25° C.

The ink composition may include 2 parts by weight of a solvent based on 100 parts by weight of the ink composition.

According to an embodiment, a film prepared from the ink composition is provided.

According to an embodiment, the film may include a matrix in which a polyether resin and a polysulfide resin may be reticularly bonded to each other.

According to an embodiment, the polyether resin and the polysulfide resin may each independently include a network structure and a chainlike structure, and the film may further include a linking portion that may crosslink the polyether resin with the polysulfide resin.

The linking portion may include an amine group.

According to another embodiment, an electronic apparatus includes: a film prepared from the ink composition, and a light-emitting device including a first electrode, a second electrode, and an interlayer between the first electrode and the second electrode, where the film may be positioned within a travel direction of light emitted from the light-emitting device.

According to an embodiment, the film may absorb first color light and emit second color light.

The electronic apparatus may further include a thin-film transistor, where the thin-film transistor may include a source electrode and a drain electrode, and the first electrode of the light-emitting device may be electrically connected to at least one of the source electrode and the drain electrode of the thin-film transistor.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
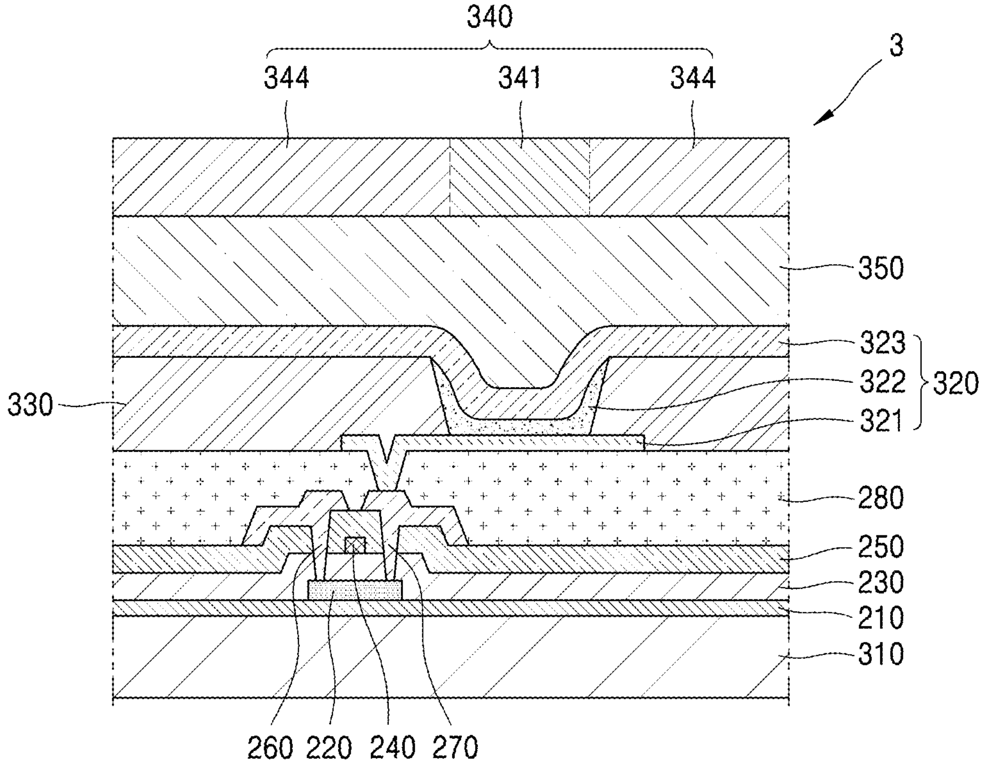
FIG. 1 is a schematic view of a light-emitting apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Effects, features, and a method of achieving the disclosure will be obvious by referring to example embodiments of the disclosure with reference to the attached drawings. The disclosure may, however, be embodied in many different forms and should not be construed as being limited to the embodiments set forth herein.

Hereinafter, the inventive concept will be described in detail by explaining example embodiments of the inventive concept with reference to the attached drawings. Like reference numerals in the drawings denote like elements, and thus their description will be omitted.

In the embodiments described in the present specification, an expression used in the singular encompasses the expression of the plural, unless it has a clearly different meaning in the context.

In the embodiments described herein, the prefix ‘poly’ means one or more plurals.

In the present specification, it is to be understood that the terms such as “including,” “having,” and “comprising” are intended to indicate the existence of the features or components disclosed in the specification, and are not intended to preclude the possibility that one or more other features or components may exist or may be added.

It will be understood that when a layer, region, or component is referred to as being “on” or “onto” another layer, region, or component, it may be directly or indirectly formed over the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

The term “room temperature” as used herein refers to a temperature of about 25° C.

In this specification, the term “matrix” refers to a polymer in which quantum dots are dispersed.

“About” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” can mean within one or more standard deviations, or within ±30%, 20%, 10% or 5% of the stated value.

Ink Composition

An ink composition may include quantum dots containing at least one organic ligand on a surface, a first monomer containing at least one epoxy group, a second monomer containing at least one oxetane group, a third monomer containing at least one thiol group, and a tertiary amine compound containing at least one allylamine group, wherein the organic ligand may contain at least one polar moiety.

The first monomer may contain 1, 2, 3, 4 or 5 epoxy groups. In particular, the first monomer may contain 2, 3, 4 or 5 epoxy groups.

The first monomer may include a ring structure and/or a linear or branched structure within a molecular structure.

For example, the first monomer may include a linear, branched, or cyclic $C_1$-$C_{20}$ alkane group, a linear, branched, or cyclic $C_1$-$C_{20}$ alkene group, or a $C_6$-$C_{20}$ arene group.

The first monomer may include an ether group or an ester group.

According to an embodiment, the first monomer may be represented by Formula 1-1 or Formula 1-2:

Formula 1-1

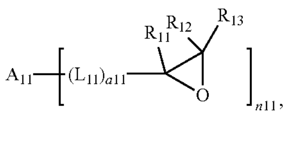

-continued

Formula 1-2

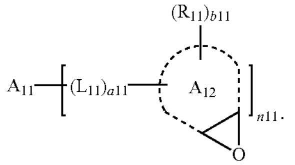

In Formulae 1-1 and 1-2, $A_{11}$ may be a linear, branched, or cyclic $C_1$-$C_{20}$ alkane group, a linear, branched, or cyclic $C_1$-$C_{20}$ alkene group, or a $C_6$-$C_{20}$ arene group, $A_{12}$ may be a cyclic $C_1$-$C_{20}$ alkane group or a cyclic $C_1$-$C_{20}$ alkene group, $L_{11}$ may be

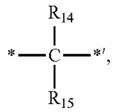

*—O—*', or

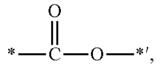

a11 may be 0, 1, 2, 3, 4, 5, 6, 7, 8, 9, or 10, $R_{11}$ to $R_{15}$ may each independently be hydrogen, deuterium, a halogen element, or a linear, branched, or cyclic $C_1$-$C_{20}$ alkyl group, b11 may be an integer from 1 to 12, n11 may be 1, 2, 3, 4, or 5, and

* and *' each indicate a binding site to an adjacent atom.

In some embodiments, when the first monomer includes a linear or branched alkane group, the following may be presented as specific examples thereof, but is not limited thereto:

Monofunctional compounds: butyl glycidyl ether, isobutyl glycidyl ether, 2-ethylhexyl glycidyl ether, hexadecyl glycidyl ether, triethyleneglycol diglycidyl ether, allyl glycidyl ether, polypropyleneglycol glycidyl ether, and glycidyl ester neodecanonate;

Bifunctional compounds: 1,4-butanediol diglycidyl ether, ethyleneglycol diglycidyl ether, 1,6-hexanediol diglycidyl ether, propyleneglycol diglycidyl ether, diethyleneglycol diglycidyl ether, neopentylglycol diglycidyl ether, 1,4-cyclohexanedimethanol diglycidyl ether, and polypropyleneglycol diglycidyl ether; and Trifunctional or polyfunctional compounds: glycerol triglycidyl ether, trimethylol propane triglycidyl ether, pentaerythritol polyglycidyl ether, dipentaerythritol polyglycidyl ether, and alkylpolyol polyglycidyl ether.

In some embodiments, when the first monomer includes a cyclic structure, the following may be presented as specific examples thereof, but is not limited thereto:

cyclohexyldimethanol glycidyl ether, dicyclopentadiene glycidyl ether, 1,2-epoxy-4-vinyl cyclohexane, 3',4'-epoxycyclohexylmethyl 3,4-epoxycyclohexyl carboxyllate, 3',4'-epoxycyclohexylmethyl-3,4-epoxycyclohexyl carboxyllate denatured caprolactone; and as aromatic cyclic compounds, naphthyl glycidyl ether, cresyl glycidyl ether, para t-butylphenol glycidyl ether, thiodiphenyl diglycidyl ether, 3-alkylphenol glycidyl ether, o-phenylphenol glycidyl ether, benzyl glycidyl ether, o-butylphenyl glycidyl ether, resorcinol diglycidyl ether, bisphenol A diglycidyl ether, bisphenol F diglycidyl ether, bisphenol S diglycidyl ether, 2,2"-diarylbisphenol A diglycidyl ether, propyleneoxide-added bisphenol A diglycidyl ether, 2-biphenyl glycidyl ether, triglycidyl aminophenol, tetraglycidyl methylene dianiline.

In some embodiments, the first monomer may be, as a commercially available compound, for example, KUKDO FINECHEM KF EPIOL products ME-100, ME101, ME103, ME105, ME106, ME102, ME700, ME701, ME702, ME704, DE200, DE 201, DE202, DE203, DE204, DE205, DE207, DE208, DE209, DE213, DE214, DE215, DE216, DE703, DE704, PE300, PE311, PE411, PE412, and PE510; EVONIK EPODIL products 733, 741, 742, 746, 747, 748, 749, 750, 757, 759, 761, 777, and 781; DAICELL CELLOXIDE products 2021P, 2000, 2081, and 8010; HEXION HELOXY™ products DB, HD, and WF, HEXION EPICOTE™ Resin products 215, 232, 235, 238, 240, 246, 320, 827, 828EL, 862, and 896; Adeka GLYCIROL ED products ED-502, ED-509, ED-529, ED-503, ED-506, ED-523T, ED-505, ED-508, and ED-512EX Adeka EP products EP-4400, EP-4520, EP4530, and EP-4005; DIC EPICLON products 520, HP-4032SS, TGAP BPFDGE, BPADGE, HP-4770, EXA-4750, and EXA-7250.

The first monomer may be used alone, or two or more different types selected from the first monomer may be used in combination.

The molecular weight of the first monomer may be in a range of about 100 grams per mole (g/mol) to about 800 g/mol.

The first monomer may be about 10 parts by weight or more and less than about 70 parts by weight, for example, about 15 parts by weight or more and less than about 50 parts by weight, or for example, about 20 parts by weight or more and less than about 40 parts by weight based on 100 parts by weight of the ink composition. When the content of the first monomer is within these ranges, the viscosity of the ink composition may be maintained, and the degree of curing and crosslinking during curing may be improved.

The second monomer may contain 1, 2, 3, 4, or 5 oxetane groups.

The second monomer may include a ring structure and/or a linear or branched structure within a molecular structure.

For example, the second monomer may include a linear, branched, or cyclic $C_1$-$C_{20}$ alkane group, a linear, branched, or cyclic $C_1$-$C_{20}$ alkene group, or a $C_6$-$C_{20}$ arene group.

The second monomer may include an ether group or an ester group.

According to an embodiment, the second monomer may be represented by Formula 2-1 or Formula 2-2:

Formula 2-1

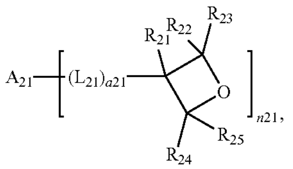

-continued

Formula 2-2

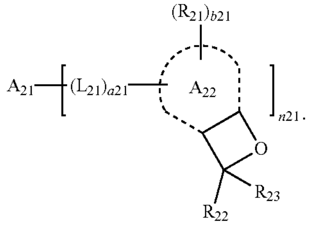

In Formulae 2-1 and 2-2, $A_{21}$ may be a linear, branched, or cyclic $C_1$-$C_{20}$ alkane group, a linear, branched, or cyclic $C_1$-$C_{20}$ alkene group, or a $C_6$-$C_{20}$ arene group, $A_{22}$ may be a cyclic $C_1$-$C_{20}$ alkane group or a cyclic $C_1$-$C_{20}$ alkene group, $L_{21}$ may be

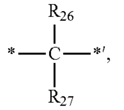

$*—O—*'$, or

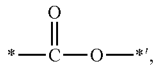

a21 may be 0, 1, 2, 3, 4, 5, 6, 7, 8, 9, or 10, $R_{21}$ to $R_{27}$ may each independently be hydrogen, deuterium, a halogen element, or a linear, branched, or cyclic $C_1$-$C_{20}$ alkyl group, b21 may be an integer from 1 to 12, n21 may be 1, 2, 3, 4, or 5, and

* and *' each indicate a binding site to an adjacent atom.

In some embodiments, the second monomer may be, for example, 1,4-bis[(3-ethyl-3-oxetanyl methoxy)methyl]benzene, 1,4-bis[(3-methyl-3-oxetanyl methoxy)methyl]benzene, 3-methyl-3-glycidyl oxetane, 3-ethyl-3-glycidyl oxetane, di[1-ethyl(3-oxetanyl)]methylether, 3-ethyl-3-hydroxymethyl oxetane, 3-ethyl-3-[(3-ethoxyoxetane-3-yl) methoxy] oxetane, 3-ethyl-3-phenoxymethyl oxetane, 3-ethyl-3-[(2-ethylhexyloxy)methyl] oxetane, oxetanyl-silicate, and phenol novolac oxetane, but is not limited thereto.

In some embodiments, the second monomer may be, as a commercially available compound, for example, TOAGOSEI ARON OXETANE products OXT-221, OXT-101, OXT-121, OXT-212, OXT-211, CHOX, and OX-SC; Ube ETERNACOLL® products EHO, OXBP, OXTP, and OXMA, but is not limited thereto.

The second monomer may be used alone, or two or more different types selected from the second monomer may be used in combination.

The molecular weight of the second monomer may be in a range of about 100 g/mol to about 800 g/mol.

The second monomer may be about 5 parts by weight or more and less than about 80 parts by weight, specifically about 10 parts by weight or more and less than about 50 parts by weight, or more specifically, about 15 parts by weight or more and less than about 30 parts by weight based on 100 parts by weight of the ink composition. When the content of the second monomer is within these ranges, the viscosity of the ink composition may be maintained, and the degree of curing and crosslinking during curing may be improved.

The content of the second monomer may be in a range of about 20 parts to about 350 parts by weight based on 100 parts by weight of the first monomer. When the ratio of the first monomer and the second monomer is within this range, the adhesive strength and/or peeling strength of the ink composition may be further improved.

The third monomer may include 1, 2, 3, 4, or 5 thiol groups. For example, the third monomer may include 2, 3, or 4 thiol groups.

The third monomer may include a ring structure, a linear structure, and/or a branched structure within a molecular structure. The third monomer may be, for example, a sulfide group, an oxo group, an alkylene group, an ether group, or an ester group within a molecular structure.

According to an embodiment, the third monomer may be represented by Formula 3-1 or Formula 3-2:

Formula 3-1

$$HS\!-\!(L_{31})_{a31}\!-\!SH,$$

Formula 3-2

$$[R_{31}\!-\!(L_{32})_{a32}]_{n32}\!-\!A_{32}\!-\![(L_{33})_{a33}\!-\!SH]_{n33}.$$

In Formulae 3-1 and 3-2, $L_{31}$ may be a linear or branched $C_1$-$C_{20}$ alkane group, a linear or branched $C_1$-$C_{20}$ alkene group, or a $C_6$-$C_{20}$ arene group, $L_{32}$ and $L_{33}$ may each be a single bond,

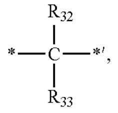

*—O—*', or

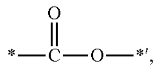

$A_{32}$ may be

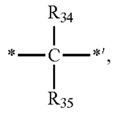

*—S—*', a $C_3$-$C_{20}$ heteroarene group, or

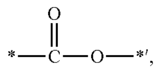

a31 to a33 may each independently be 1, 2, 3, 4, 5, 6, 7, 8, 9, or 10, $R_{31}$ to $R_{35}$ may each independently be hydrogen, deuterium, a halogen element, or a linear, branched, or cyclic $C_1$-$C_{20}$ alkyl group, n32 and n33 may each independently be 0, 1, 2, 3, 4, or 5, and the sum of n32 and n33 may be 1 or greater.

* and *' each indicate a binding site to an adjacent atom.

In some embodiments, examples of the third monomer may be as follows, but embodiments are not limited thereto:

dimercaptodiethyl sulfide, 1,8-dimercapto-3,6-dioxooctane, ethylene bis(3-mercapto propionate), pentaerythritol tetrakis(3-mercaptopropionate), pentaerythritol tetrakis(2-mercaptoacetate), trimethylolpropanetris (3-mercaptopropionate), tetraethylene glycol bis(3-mercaptopropionate), dipentaerythritol hexakis (3-mercaptopropionate), tris[2-(3-mercaptopropionyloxy) ethyl] isocyanurate, 1,4-bis(3-mercaptobutyryloxy) butane, pentaerythritol tetrakis (3-mercaptobutyrate), 1,3,5-tris[2-(3-mercaptobutyryloxy)ethyl]-1,3,5-triazine-2,4,6(1H,3H,5H)-trione, 1,6-hexanedithiol, 1,3-propanedithiol, 1,2-ethanedithiol, glycol dimercaptoacetate, ethoxylated glycol dimercapto acetate, ethoxylated trimethylpropane tri(3-mercaptopropionate), polypropylene glycol di(3-mercaptopropionate), and polyethyleneglycol dithiol including 1 to 10 ethyleneglycol repeating units.

In some embodiments, the third monomer may be, as a commercially available compound, for example, DMES and DMDO of Itochu Specialty Chemical Inc; EBMP from Hampshire Chemicals; PEMP, TMMP, EGMP-4, DPMP from Sakai Chemical; TEMPIC, Karenz MT BD1, Karenz MT PE1, Karenz MT NR1 from Showa Denko; or HDT of Aldrich Chemical Co., etc.

The third monomer may be used alone, or two or more different types selected from the third monomer may be used in combination.

The molecular weight of the third monomer may be in a range of about 100 g/mol to about 800 g/mol.

The third monomer may be about 10 parts by weight or more and less than about 50 parts by weight, or for example, about 15 parts by weight or more and less than about 30 parts by weight based on 100 parts by weight of the ink composition. When the content of the third monomer is within these ranges, the viscosity of the ink composition may be maintained, and the degree of curing and crosslinking during curing may be improved.

According to an embodiment, the tertiary amine compound containing at least one allylamine group may include Formula 4-1 or Formula 4-2:

Formula 4-1

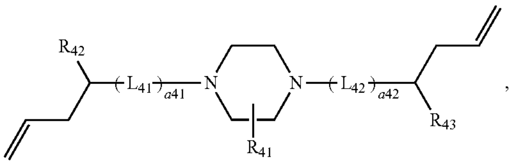

,

Formula 4-2

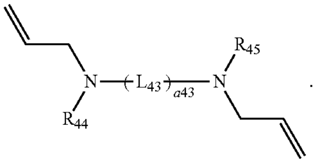

.

In Formulae 4-1 and 4-2, $L_{41}$, $L_{42}$, and $L_{43}$ may each independently be a direct bond,

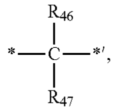, or 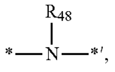, a41 and a42 may each independently be 0, 1, 2, 3, 4, or 5, a43 may be 1, 2, 3, 4, or 5, $R_{41}$ to $R_{48}$ may each independently be hydrogen, deuterium, halogen element, $—CH_2—CH═CH_2$, or a substituted or unsubstituted linear, branched, or cyclic $C_1$-$C_{20}$ alkyl group, a substituent of the linear, branched, or cyclic $C_1$-$C_{20}$ alkyl group may include deuterium, a halogen element, or $—N(CH_2—CH═CH_2)_2$, and

* and *' each indicate a binding site to an adjacent atom.

In some embodiments, the tertiary amine compound containing at least one allylamine group may be, for example, 1,4-diallylpiperazine, 1,4-diallyl-2-methyl-piperazine, N-allyl-N-[2-(4-allylpiperazin-1-yl)ethyl]prop-2-en-1-amine, 3-[4-[3-(diallylamino)ethyl]piperazin-1-yl]-N,N-diallylethan-1-amine, N,N,N',N'-tetraallylethane-1,2-diamine, N,N'-dimethyl-N,N'-diallylethane-1,2-diamine, N,N'-diethyl-N,N'-diallylethane-1,2-diamine, N-[2-(diallylamino)ethyl]-N,N',N'-triallylethane-1,2-diamine, N,N-bis[2-(diallylamino)ethyl]-N',N'-diallylethane-1,2-diamine, or N,N'-bis[2-diallylamino)ethyl]-N,N'-diallylethane-1,2-diamine, but is not limited to.

The structures of examples of the tertiary amine compound containing at least one allylamine group are shown as follows.

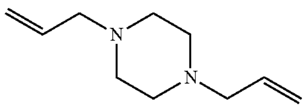

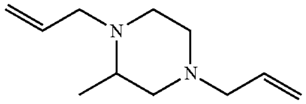

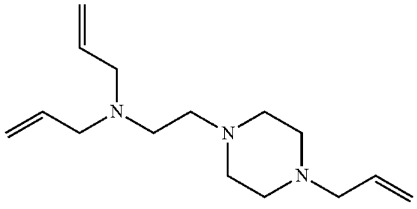

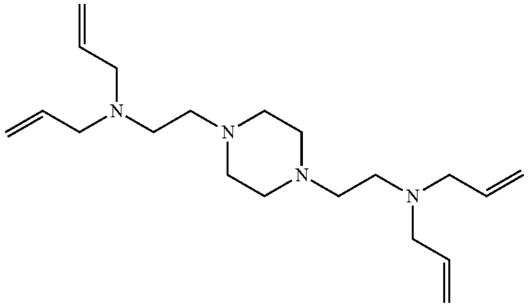

-continued

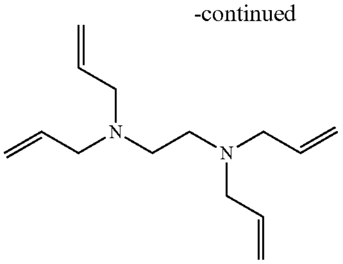

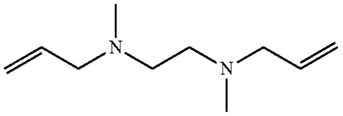

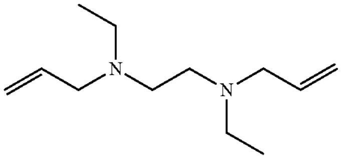

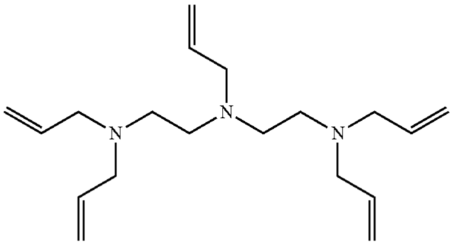

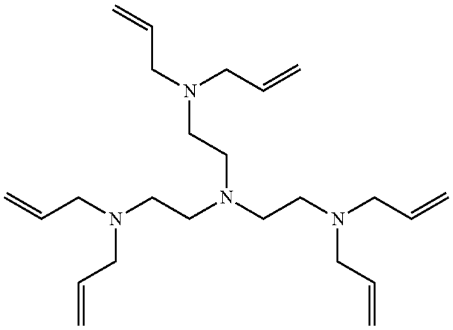

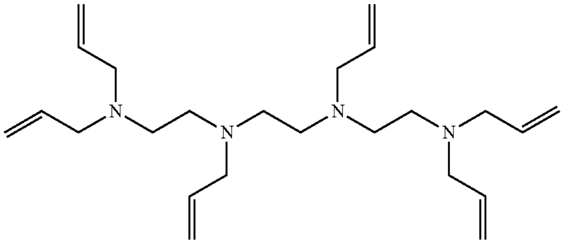.

The content of the tertiary amine compound containing at least one allylamine group may be in a range of about 50 parts to about 500 parts by weight, based on 100 parts by weight of the first monomer. When the content of the tertiary amine compound containing at least one allylamine group is within this range, the viscosity of the ink composition may be maintained, the curing reaction rate may be sufficiently accelerated, and the physical properties and/or adhesion of the provided film may not be impaired.

The double bond of the tertiary amine compound containing at least one allylamine group may react with a thiol group of the third monomer to cause thiol-ene polymerization. The thiol-ene system may have the property of inhibiting cationic photopolymerization of an epoxy group of the first monomer or an oxetane group of the second monomer. However, by using a polyfunctional tertiary amine compound containing at least one allylamine group, anionic polymerization of an epoxy group or oxetane group activated by heat emitted by a thiol-ene reaction induced by UV curing may be initiated.

The mechanism of thiol-ene reaction and anionic epoxy polymerization reaction of the tertiary amine compound containing an allyl group is shown below.

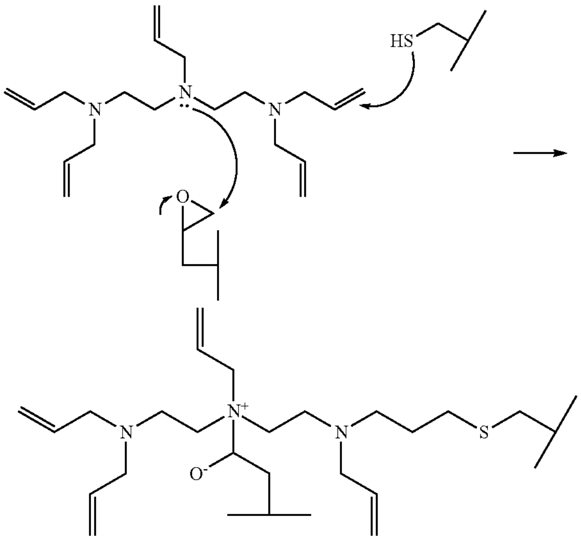

The polymer produced by curing the ink composition according to an embodiment may include a polymer cross-linked structure, in which polyether and polysulfide are reticularly bonded to each other. The polyether is a polymer derived from a monomer containing an epoxy group or an oxetane group, and the polysulfide is a polymer derived from a monomer containing a thiol group. In an embodiment, the polyether polymer and the polysulfide polymer may each independently have a network structure or a chain structure.

Due to the polymer crosslinked structure, the polymer may disperse stress while improving impact resistance. On the other hand, when the concentration of polysulfide with flexible properties in the resulting polymer reaches a certain level or higher, toughness is improved. In addition, unlike a case where soft materials such as liquid rubber are added to epoxy resin to improve toughness, a completely homogeneous material may be produced by the mixed reaction of epoxy-am ine/thiol-ene and curing. Thus, the mechanical and optical properties of the film thus formed are better. In addition, the effect of suppressing deformation due to an external force that occurs when a polymer by thiol-ene reaction is formed alone may be expected.

In an embodiment, the ink composition may include less than 2 parts by weight of a solvent based on 100 parts by weight of the ink composition. In an embodiment, the ink composition may substantially not include the solvent. That is, the ink composition may be a solventless ink composition.

The ink composition may be used for application to an inkjet process by not including a solvent. In detail, in the case where the ink composition includes the solvent, the inkjet process needs to be performed to about five times the thickness when the solventless ink composition is used, to obtain a target level of the film thickness after drying. Accordingly, the ink composition including the solvent is disadvantageous for precisely forming a film, and color mixture between pixels, for example, may easily occur when forming a color conversion member. In addition, when an ink composition that includes a solvent is used, nozzle drying and nozzle clogging may occur due to solvent volatilization, and an organic solvent may remain in the formed film, affecting deterioration of other organic layers, which may adversely affect reliability by emitting out-gas.

The ink composition may further include a photopolymerization initiator. The photopolymerization initiator is a compound that may initiate by forming a radical by light. The photopolymerization initiator is for accelerating polymerization and improving the curing rate, and a suitable photopolymerization initiator known in the art may be used without any particular limitation.

According to an embodiment, the photopolymerization initiator may include a triazine-based compound, an acetophenone compound, a benzophenone compound, a thioxanthone compound, a benzoin compound, an oxime ester compound, an am inoketone compound, a phosphine or phosphine oxide compound, a carbazole-based compound, a diketone compound, a sulfonium bolate-based compound, a diazo-based compound, a non-imidazole-based compound, or a combination thereof, but is not limited thereto.

Examples of the triazine-based compound may include 2,4,6-trichloro-s-triazine, 2-phenyl-4,6-bis(trichloro methyl)-s-triazine, 2-(3',4'-dimethoxy styryl)-4,6-bis (trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-tolyl)-4,6-bis(trichloro methyl)-s-triazine, 2-biphenyl-4,6-bis(trichloro methyl)-s-triazine, bis(trichloro methyl)-6-styryl-s-triazine, 2-(naphtho-1-yl)-4,6-bis(trichloro methyl)-s-triazine, 2-(4-methoxy naphtho-1-yl)-4,6-bis(trichloro methyl)-s-triazine, 2,4-trichloro methyl(piperonyl)-6-triazine, and 2,4-(trichloro methyl(4'-methoxy styryl)-6-triazine, but is not limited thereto.

Examples of the acetophenone-based compound may include 2,2'-diethoxy acetophenone, 2,2'-dibutoxy acetophenone, 2-hydroxy-2-methylpropiophenone, p-t-butyl trichloro acetophenone, p-t-butyl dichloro acetophenone, 4-chloro acetophenone, 2,2'-dichloro-4-phenoxy acetophenone, 2-methyl-1-(4-(methylthio)phenyl)-2-morpholino propan-1-one, and 2-benzyl-2-dimethyl amino-1-(4-morpholino phenyl)-butan-1-one, but is not limited thereto.

Examples of the benzophenone-based compound may include benzophenone, benzoyl benzoate, benzoyl benzoate methyl, 4-phenyl benzophenone, hydroxy benzophenone, acrylic benzophenone, 4,4'-bis(dimethyl am ino)benzophenone, 4,4'-dichloro benzophenone, and 3,3'-dimethyl-2-methoxy benzophenone, but is not limited thereto.

Examples of the thioxanthone-based compound may include thioxanthone, 2-methyl thioxanthone, isopropyl thioxanthone, 2,4-diethyl thioxanthone, 2,4-diisopropyl thioxanthone, and 2-chloro thioxanthone, but is not limited thereto.

Examples of the benzoin-based compound may include benzoin, benzoin methyl ether, benzoin ethyl ether, benzoin isopropyl ether, benzoin isobutyl ether, and benzyl dimethyl ketal, but is not limited thereto.

Examples of the oxime-based compound may include 2-(o-benzoyl oxime)-1-[4-(phenylthio)phenyl]-1,2-octanedione, and 1-(o-acetyloxime)-1-[9-ethyl-6-(2-methylbenzoyl)-9H-carbazol-3-yl]ethanone, but is not limited thereto.

Examples of the phosphine or phosphine oxide compound may include 2,4,6-tri alkylbenzoyl diphenylphosphine oxide, 2,4,6-tri alkylbenzoyl diphenyl phosphinate, or a combination thereof, but is not limited thereto.

The content of the photopolymerization initiator in the composition is not particularly limited and may be properly selected. In some embodiments, the content of the polymerization initiator may be in a range of about 0.0001 parts to about 10 parts by weight, about 0.001 parts to about 10 parts by weight, about 0.01 parts to about 10 parts by weight, or about 0.1 parts to about 5 parts by weight based on 100 parts by weight of the ink composition, but is not limited thereto. In some embodiments, the content of the photopolymerization initiator may be in a range of about 0.01 parts to about 10 parts by weight, about 0.1 parts to about 10 parts by weight, or about 1 part to about 5 parts by weight based on 100 parts by weight of a mixture of a third monomer containing at least one thiol group and a tertiary amine compound containing at least one allylamine group, but is not limited thereto. When the content of the photopolymerization initiator is within these ranges, a sufficiently high working speed may be obtained, and film non-uniformity due to an excessively rapid curing reaction may be reduced.

The ink composition according to one or more embodiments may include quantum dots. The quantum dots are not particularly limited as long as they may emit light by absorbing light, and the quantum dots may include a group II-VI semiconductor compound; a group III-V semiconductor compound; a group III-VI semiconductor compound; a group I-III-VI semiconductor compound; a group IV-VI semiconductor compound; a group IV element or compound; or a combination thereof.

Examples of the group II-VI semiconductor compound may include a binary compound such as CdS, CdSe, CdTe, ZnS, ZnSe, ZnTe, ZnO, HgS, HgSe, HgTe, MgSe, or MgS; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound such as CdZnSeS, CdZnSeTe, CdZnSTe, CdHgSeS, CdHgSeTe, CdHgSTe, HgZnSeS, HgZnSeTe, or HgZnSTe; or a combination thereof.

Examples of the group III-V semiconductor compound may include a binary compound such as GaN, GaP, GaAs, GaSb, AlN, AlP, AlAs, AlSb, InN, InP, InAs, or InSb; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or a combination thereof. In some embodiments, the group III-V semiconductor compound may further include a group II element. Examples of the group III-V semiconductor compound further including the group II element may include InZnP, InGaZnP, InAlZnP, and the like.

Examples of the III-VI group semiconductor compound may include a binary compound such as GaS, GaSe, $Ga_2Se_3$, GaTe, InS, InSe, $In_2S_3$, $In_2Se_3$, InTe, and the like; a ternary compound such as $InGaS_3$, $InGaSe_3$, and the like; or a combination thereof.

Examples of the group semiconductor compound may include a ternary compound such as AgInS, $AgInS_2$, CuInS, $CuInS_2$, $CuGaO_2$, $AgGaO_2$, or $AgAlO_2$; or a combination thereof.

Examples of the group IV-VI semiconductor compound may include a binary compound such as SnS, SnSe, SnTe, PbS, PbSe, or PbTe; a ternary compound such as SnSeS, SnSeTe, SnSTe, PbSeS, PbSeTe, PbSTe, SnPbS, SnPbSe, or SnPbTe; a quaternary compound such as SnPbSSe, SnPbSeTe, or SnPbSTe; or a combination thereof.

The group IV element or compound may be a single element material such as Si or Ge; a binary compound such as SiC or SiGe; or a combination thereof.

Individual elements included in the multi-element compound, such as a binary compound, a ternary compound, and a quaternary compound, may be present in a particle thereof at a uniform or non-uniform concentration.

The quantum dot may be a homogeneous single structure; a double structure such as a core-shell structure; a triple structure such as a core-shell-shell structure; a gradient structure; or a mixed structure thereof. In some embodiments, materials included in the core may be different from materials included in the shell.

Examples of the shell of the quantum dot include metal, metalloid or nonmetal oxide, a semiconductor compound, or a combination thereof. Examples of the metal, the metalloid or the nonmetal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound such as $MgAl_2O_4$, $CoFe_2O_4$, $NiFe_2O_4$, or $CoMn_2O_4$; or a combination thereof. Examples of the semiconductor compound may include a group II-VI semiconductor compound; a group III-V semiconductor compound; a group III-VI semiconductor compound; a group I-III-VI semiconductor compound; a group IV-VI semiconductor compound; or a combination thereof.

According to an embodiment, the core may include at least one material selected from the group consisting of CdSe, CdS, InP, InGaP, ZnS, ZnSe, CdTe, CdSeTe, CdZnS, PbSe, AgInZnS, and ZnO, but embodiments are not limited thereto.

According to an embodiment, the shell may include at least one material selected from the group consisting of CdSe, ZnSe, ZnS, ZnTe, CdTe, PbS, TiO, SrSe, and HgSe, but embodiments are not limited thereto.

The quantum dots may include at least one organic ligand on a surface, and the organic ligand may include at least one polar moiety. The monomers included in the ink composition may have a relatively high polarity. Therefore, when the polarity of the quantum dots is low, it may be difficult to homogeneously disperse the quantum dots in the ink composition. Therefore, to increase the polarity of the quantum dots, an organic ligand that includes at least one polar moiety may be used.

For example, the polar moiety may include an oxyalkylene group. In some embodiments, the polar moiety may be a substituted or unsubstituted oxymethylene group or a substituted or unsubstituted oxyethylene group. For example, a ligand in which a linker functional group that is easy to bond to a surface of quantum dots is combined with one or both ends of the oxyalkylene group of a single or repeating structure may be used, but the ligand is not limited to the molecular structure as such, and polar ligand molecules known in the art may be used for the purpose.

In some embodiments, the polar moiety may be tetramethoxyethylene glycol.

According to an embodiment, the ligand and the quantum dot may be chemically bonded via a hydroxy group, a mercapto group, a carboxy group, an ester group, and/or a phosphoric acid group.

According to an embodiment, the ligand may further include a linear, branched, or cyclic $C_1$-$C_{20}$ alkane group, a linear, branched, or cyclic $C_1$-$C_{20}$ alkene group, a $C_6$-$C_{20}$ arene group, or a $C_1$-$C_{20}$ heteroarene group.

The quantum dots may be prepared by: dispersing quantum dots, which include a ligand that does not include a polar moiety on a surface, in a non-polar solvent; adding a ligand including a polar moiety to the dispersion solution and stirring; and extracting a supernatant by centrifugation and drying to obtain quantum dots including a ligand including at least one polar moiety on a surface.

In some embodiments, the content of the quantum dots may be in a range of about 20 parts to about 60 parts by weight, specifically about 25 parts to about 50 parts by weight, or more specifically, about 30 parts to about 45 parts by weight based on the ink composition 100 parts by weight.

The ink composition may further include a scatterer. The scatterer is not limited as long as the scatterer scatters and diffuses light not absorbed by the quantum dots and allows the scattered light to be absorbed again by the quantum dots. That is, the scatterer may increase the amount of light absorbed by the quantum dots, thereby increasing the light conversion efficiency of the color conversion layer.

In an embodiment, the scatterer may include a plurality of inorganic particles having different particle diameters.

In some embodiments, the scatterer may include at least one selected from $BiFeO_3$, $Fe_2O_3$, $WO_3$, $TiO_2$, SiC, $BaSO_4$, $BaTiO_3$, ZnO, $ZrO_2$, ZrO, $Ta_2O_5$, $MoO_3$, $TeO_2$, $Nb_2O_5$, $Fe_3O_4$, $V_2O_5$, $Cu_2O$, BP, $Al_2O_3$, $In_2O_3$, $SnO_2$, $Sb_2O_3$, $CaCO_3$, and ITO, or a combination thereof.

In some embodiments, an average diameter of the scatterer may be in a range of about 150 nanometers (nm) to about 250 nm, specifically about 180 nm to about 230 nm. When the average diameter of the scatterer is within any of these ranges, more improved light scattering effects may be obtained, and light conversion efficiency of the light conversion layer may be improved.

In some embodiments, a refractive index of the scatterer may be greater than 1.5.

As described above, the scatterer may include inorganic particles having various particle diameters, such that a refractive index may be increased. Accordingly, a difference in refractive index between the scatterer and the surrounding members may be increased, and thus, a total reflection of blue light may highly likely occur, and thus, the absorption rate of blue light may be increased, and light conversion efficiency may be improved.

In some embodiments, the content of the scatterer may be in a range of about 0.1 parts to about 20 parts by weight, or for example, about 1 part to about 15 parts by weight based on 100 parts by weight of the ink composition. When the content of the scatter is within any of these ranges, there is an effect of improving the light conversion efficiency according to use of the scatterer, and the light conversion efficiency may not be lowered because it is possible to include quantum dots of an appropriate ratio.

In an embodiment, the ink composition may further include various additives, and thus, various modifications to the ink composition are possible. In some embodiments, the ink composition may include, as an additive, a surfactant, an adhesion enhancer, a sensitizer, a stabilizer, or a combination thereof.

In some embodiments, the ink composition may further include a surfactant, for example, a fluorine-based surfactant or a silicone-based surfactant to improve coating properties and leveling performance.

The fluorine-based surfactant may have a weight average molecular weight of about 4,000 g/mol to about 10,000 g/mol, and specifically may have a weight average molecular weight of about 6,000 g/mol to about 10,000 g/mol. In addition, the fluorine-based surfactant may have a surface tension of about 18 millinewtons per meter (mN/m) to about 23 mN/m (measured in 0.1% propyleneglycol monomethylether acetate ("PGMEA") solution). When the weight average molecular weight and surface tension of the fluorine-based surfactant are within these ranges, the leveling performance may be further improved, and occurrence of stains during coating may be prevented, and occurrence of bubbles is relatively small, thus reducing membrane defects.

Examples of the fluorine-based surfactant, as a commercially available compound, may include DIC MEGAFACE® products F-114, F-251, F-253, F-281, F-410, F-430, F-477, F-510, F-551, F-552, F-553, F-554, F-555, F-556, F-557, F-558, F-559, F-560, F-561, F-562, F-563, F-565, F-568, F-569, F-570, F-572, F-574, F-575, F-576, R-4, R-41, R-94, RS-56, RS-72-K, RS-75, RS-76-E, RS-76-NS, RS-78, RS-90, DS-21; 3M Fluorosurfactant® products FC-135, FC-170C, FC-430, FC-431, FC-4430, FC-4433; AGC SURFLON® products S-211, S-221, S-231, S-232, S-241, S-242, S-243, S-420, S-431, S-386, S-611, S-647, S-651, S-653, S-656, S-658, F693; DuPONT CPASTONE® products FS-30, FS-65, FS-31, FS-3100, FS-34, FS-35, FS-50, FS-51, FS-60, FS-61, FS-63, FS-64, FS-81, FS-22, and FS-83, but embodiments are not limited thereto.

In addition, the surfactant may be a silicone-based surfactant. Examples of the silicone-based surfactant, as a commercially available compound, may include Evonik DYNOL products DYNOL 360, DYNOL 604, DYNOL 607, DYNOL 800, DYNOL 810, TEGO products, Twin 4000, Twin 4100, Twin 4200; BYK BYK-300, BYK-301, BYK-302, BYK-306, BYK-307, BYK-310, BYK-313, BYK-315N, BYK-320, BYK-322, BYK-323, BYK-325N, BYK-326, BYK-327, BYK-329, BYK-330, BYK-331, BYK-332, BYK-333, BYK-342, BYK-345, BYK-346, BYK-347, BYK-348, BYK-350, BYK-352, BYK-354, BYK-355, BYK-356, BYK-358N, BYK-359, BYK-360P, BYK-361N, BYK-364P, BYK-366P, BYK-368P, BYK-370, BYK-375, BYK-377, BYK-378, BYK-381, BYK-390, BYK-392, and BYK-394, but embodiments are not limited thereto.

The surfactant may be included about 0.01 parts to about 5 parts by weight, or specifically, about 0.1 parts to about 2 parts by weight based on 100 parts by weight of the ink composition.

According to an embodiment, the ink composition may further include an adhesion enhancer.

The adhesion enhancer may include, for example, a titanium-based enhancer, an aluminum-based enhancer, or a silane-based adhesion enhancer.

Examples of the silane-based adhesion enhancer may include, epoxy-based silane binders, such as 3-glycidyloxypropyl trimethoxysilane, 3-glycidyloxypropyl triethoxysilane, 3-glycidyloxypropyl (dimethoxy)methylsilane, or 2-(3,4-epoxycyclohexyl)ethyl trimethoxysilane; mercapto-based silane binders, such as 3-mercaptopropyl trimethoxysilane, 3-mercaptopropyl triethoxysilane, 3-mercaptopropyl methyldimethoxysilane, or 11-mercaptoundecyl trimethoxysilane; amino-based silane binders, such as 3-aminopropyl trimethoxysilane, 3-aminopropyl triethoxysilane, 3-aminopropyl dimethoxymethylsilane, N-phenyl-3-aminopropyl trimethoxysilane, N-methylaminopropyl trimethoxysilane, N-(2-aminoethyl)-3-aminopropyl trimethoxysilane, or N-(2-aminoethyl)-3-aminopropyl dimethoxymethylsilane; ureide-based silane binders, such as 3-ureidepropyl triethoxysilane; vinyl-based silane binder, such as vinyl trimethoxysilane, vinyl triethoxysilane, vinyl methyldiethoxy silane; styryl-based silane binders, such as p-styryl trimethoxysilane; acrylate-based silane binders, such as 3-acryloxypropyl trimethoxysilane, or 3-methacryloxypropyl trimethoxysilane; isocyanate-based silane binders, such as 3-isocyanate propyl trimethoxysilane; sulfide-based silane binders, such as bis(triethoxysilylpropyl)disulfide, bis(triethoxysilylpropyl)tetrasulfide; phenyl trimethoxysilane, methacryloxypropyl trimethoxysilane, imidazolesilane, and triazinesilane, but embodiments are not limited thereto. Examples of the adhesion enhancer include, as commercially available compounds, Shin Etsu KBM-1003, KBE-1003, KBM-303, KBM-402, KBM-403, KBE-402, KBE-403, KBM-1403, KBM-502, KBM-503, KBE-502, KBE-503, KBM-5103, KBM602, KBM-603, KBM-903, KBE-903, KBE-9103P, KBM-573, KBM-575, KBE-585, KBE-9007N, KBM-9659, KBM-802, and KBM-803; Gelest SIA02000.0, SIS6964.0, SIA08591.0, SIS6964.0, SIB1824.5, SIA0591.0, SIT8192.6, SIG5840.0, SIB1834.0, SIE4668.0, SIA0599.2, SIC2295.5, SIB1833.0, SIA0611.0, SIG5840.0, SIB1140.0, SIB1833.0, SIS6990.0, SIB1832.0, SIE4670.0, SIM6487.4, SIB1828.0, SIM6487.4, SIS6994.0, SIB1140.0, SIM6476.0, SIU9058.0, SII6455.0, SIT8717.0, SSP-055, SIA0780.0, and VEE-005; KCC SA6112C, SA1003O, SA0004O, SA3003O, SA4003O, SA1003M, SB1003M, SB1013E, SB1022M, SB2003M, and SB3003M, but embodiments are not limited thereto.

The adhesion enhancer may be included about 0.1 parts to about 10 parts by weight, or specifically, about 0.5 parts to about 5 parts by weight based on 100 parts by weight of the ink composition. The adhesion enhancer may be included about 0.1 parts to about 10 parts by weight, or specifically, about 0.5 parts to about 5 parts by weight based on 100 parts by weight of the sum of the first monomer and the second monomer in the ink composition. The adhesion enhancer may be included about 0.1 parts to about 10 parts by weight, or specifically, about 0.5 parts to about 5 parts by weight based on 100 parts by weight of the sum of the first monomer, the second monomer, and the third monomer in the ink composition.

According to an embodiment, the ink composition may further include a sensitizer. The sensitizer may further improve polymerization initiation efficiency of a polymerization initiator, thereby accelerating the curing reaction of the ink composition.

The sensitizer may complement curability in long-wavelength light of 300 nm or more. The sensitizer may be a compound that absorbs wavelengths in a range of about 250 nm to about 405 nm, about 300 nm to about 405 nm, or about 350 nm to about 395 nm.

Examples of the sensitizer include: anthracene-based compounds, such as 9,10-dimethoxy anthracene, 9,10-diethoxyanthracene, 9,10-dibutoxyanthracene, and 2-ethyl-9,10-dimethoxyanthracene; benzophenone-based compounds, such as 4,4-bis(dimethylamino)benzophenone, 4,4-bis(diethylamino) benzophenone, 2,4,6-trimethylaminobenzophenone, methyl-o-benzoylbenzoate, 3,3-dimethyl-4-methoxy-benzophenone, and 3,3,4,4-tetra(t-butylperoxycarbonyl) benzophenone; ketone-based compounds, such as dimethoxyacetophenone, diethoxy acetophenone, 2-hydroxy-2-methyl-1-phenylpropan-1-one, and propanone; fluorenone-based compounds, such as 9-fluorenone, 2-chloro-9-fluorenone, and 2-methyl-9-fluorenone; thioxanthone-based compounds, such as thioxanthone, 2,4-diethyl thioxanthone, 2-chloro thioxanthone, 1-chloro-4-propyloxy thioxanthone, isopropylthioxanthone (ITX), and diisopropylthioxanthone; xanthone-based compounds, such as xanthone and 2-methylxanthone; anthraquinone-based compounds, such as anthraquinone, 2-methyl anthraquinone, 2-ethyl anthraquinone, t-butyl anthraquinone, and 2,6-dichloro-9,10-anthraquinone; acridine-based compounds, such as 9-phenylacridine, 1,7-bis(9-acridinyl)heptane, 1,5-bis(9-acridinylpentane), and 1,3-bis(9-acridinyl)propane; dicarbonyl compounds, such as benzyl, 1,7,7-trimethyl-bicyclo[2,2,1]heptane-2,3-dione, 9,10-phenanthrenequinone; phosphine oxide-based compounds, such as 2,4,6-trimethylbenzoyl diphenylphosphine oxide, and bis(2,6-dimethoxybenzoyl)-2,4,4-trimethylpentyl phosphine oxide; benzoate-based compounds, such as methyl-4-(dimethylamino)benzoate, ethyl-4-(dimethylamino) benzoate, and 2-n-butoxyethyl-4-(dimethylamino)benzoate; amino-based compounds, such as 2,5-bis(4-diethylaminobenzal)cyclopentanone, 2,6-bis(4-diethylaminobenzal)cyclohexanone, and 2,6-bis(4-diethylaminobenzal)-4-methyl-cyclopentanone; coumarin-based compounds, such as 3,3-carbonylvinyl-7-(diethylamino) coumarin, 3-(2-benzothiazolyl)-7-(diethylamino)coumarin, 3-benzoyl-7-(diethylamino) coumarin, and 3-benzoyl-7-methoxy-coumarin; chalcone compounds, such as 4-diethylamino chalcone and 4-azidbenzalacetophenone; 2-benzoylmethylene; and 3-methyl-beta-naphthothiazoline, but embodiments are not limited thereto.

The sensitizer may be included about 0.05 parts to about 3 parts by weight, or specifically, about 0.1 parts to about 1 part by weight based on 100 parts by weight of the ink composition. When the content of the sensitizer is within this range, the sensitization effect may be sufficiently obtained, and light may be transmitted to a deep part.

According to an embodiment, the ink composition may further include a stabilizer, for example, an antioxidant, an ultraviolet absorber, and/or an anti-agglomeration agent. The stabilizer may be used to prolong a shelf life of the ink composition.

Examples of the antioxidant include 2,6-di-t-butyl-4-methylphenol, 3,5-di-t-butyl-4-hydroxybenzaldehyde, 2-t-butyl-4-methoxyphenol, 1,3,5-tris[(4-t-butyl-3-hydroxy-2,6-dimethylphenyl)methyl]-1,3,5-triazine-2,4,6-trione, [3-[3-(3,5-di-t-butyl-4-hydroxyphenyl)propanoyloxy]-2,2-bis[3-(3,5-di-t-butyl-4-hydroxyphenyl) propanoyloxymethyl] propyl]3-(3,5-di-t-butyl-4-hydroxyphenyl)propanoate, [3-[3-(3,5-di-t-butyl-4-hydroxyphenyl) propanoyloxy]-2,2-bis[3-(3,5-di-t-butyl-4-hydroxyphenyl) propanoyloxymethyl] propyl]3-(3,5-di-t-butyl-4-hydroxyphenyl)propanoate, octadecyl-3-(3,5-di-t-butyl-4-hydroxyphenyl)propanoate, tris(2,4-di-t-butylphenyl)phosphite, (4,4'-thio-bis(2-t-butyl-5-methylphenol, 2,2'-thio-bis(4-methyl-6-t-butylphenol), and 2,6-di-t-butyl-4-methylphenol, but embodiments are not limited thereto.

Examples of the ultraviolet absorber include 2-(3-t-butyl-2-hydroxy-5-methylphenyl)-5-chlorobenzotiriazole, alkoxybenzophenone bis(2,2,6,6-tetramethyl piperidine-4-yl) decandionate, 2-hydroperoxy-2-methylpropane, bis(3,3,5,5-tetramethyl piperidine-4-yl) decandionate, and 4-methylhexyl-3-[3-(benzotiriazole-2-yl)-5-t-butyl-4-hydroxyphenyl] propanoate), but embodiments are not limited thereto.

The anti-agglomeration agent may include sodium polyacrylate and the like, but embodiments are not limited thereto.

The stabilizer may be in a range of about 0.05 parts to about 10 parts by weight, specifically about 0.1 parts to about 5 parts by weight, or more specifically about 0.1 parts to about 3 parts by weight, based on 100 parts by weight of the ink composition.

The viscosity of the ink composition may be 80 centipoise (cP) or less, specifically about 10 cP to about 80 cP, about 20 cP to about 80 cP, or about 20 cP to about 70 cP at 25° C. The ink composition satisfying the viscosity range may be suitable for manufacturing a film by using a solution process, for example, an inkjet printing method.

The ink composition may have a surface tension of about 10 dynes/cm to about 40 dynes/cm at room temperature. The ink composition satisfying the surface tension range may be suitable for manufacturing a film by using a solution process, for example, an inkjet printing method.

The ink composition may pass through a filter having a pore size of 20 micrometers (μm) or less, specifically 5 μm or less.

Film

Hereinafter, a film formed using the ink composition will be described.

The film may be formed by curing the ink composition described above. That is, the film may include a cured product of the ink composition.

According to an embodiment, the film may be formed by providing the ink composition on a substrate to form a pattern; and curing the pattern.

According to an embodiment, the providing of the ink composition to form a pattern may be performed by a solution process. The solution process may be an inkjet printing method, a spin coating method, a slit coating method, a drop casting method, a casting method, a gravure coating method, a bar coating method, a roll coating method, a dip coating method, a spray coating method, a screen coating method, a flexo printing method, an offset printing method, or a nozzle printing method, but is not limited thereto.

In an embodiment, the solution process may be performed by an inkjet printing method, but is not limited thereto. For example, the ink composition may be provided by jetting microdroplets into a predetermined area in the form of microdroplets by an inkjet printing method on a substrate. In some embodiments, the ink composition may be provided on a substrate with a thickness of about 0.5 μm to about 20 μm by inkjet printing.

Since the ink composition has excellent inkjet ejection stability, the ink composition may be suitably used for inkjet printing.

The inkjet printing method may use an inkjet printer having an inkjet head equipped with a piezo-type nozzle that applies pressure according to a voltage.

In an embodiment, the ink composition is ejected from a nozzle of an inkjet head onto a substrate.

The ejection amount of the ink composition may be in a range of about 1 picoliter per time (pL/time) to about 80 pL/time, for example, about 1 pL/time to about 30 pL/time, or for example, 1 pL/time to 20 pL/time.

An aperture diameter of the inkjet head may be about 5 micrometers (μm) to about 100 μm, for example, about 10 μm to about 80 μm to reduce nozzle clogging and improve ejection precision, but embodiments are not limited thereto.

An ejection pressure of the inkjet head may be 1,000 $s^{-1}$ to 100,000 $s^{-1}$ based on the shear rate, but embodiments are not limited thereto.

A temperature at a point of ejection is not particularly limited, but from a viewpoint of suppressing crystallization of materials contained in the ink composition, the temperature may be in a range of about 10° C. to about 120° C., for example, about 15° C. to about 60° C., for example, about 15° C. to about 40° C., or for example, about 20° C. to about 35° C.

According to an embodiment, in the curing of the pattern, a photocuring process or a thermosetting process may be used, but when an organic compound susceptible to heat is adjacent to the pattern, a photocuring process may be preferred. The curing of the pattern may be performed by irradiating light having an intensity of about 1 W to about 500 W and/or a wavelength of about 250 nm to about 450 nm, but embodiments are not limited thereto.

In an embodiment, the substrate may be an electrode of the light-emitting device, but embodiments of the disclosure are not limited thereto.

According to an embodiment, the ink composition may be provided on the one electrode with a thickness of about 1 μm to about 100 μm, or for example, about 5 μm to about 20 μm.

Electronic Apparatus

Hereinafter, an electronic apparatus including the above-described film will be described.

The electronic apparatus may include: the film; and a light-emitting device including a first electrode, a second electrode, and an interlayer between the first electrode and the second electrode.

In an embodiment, the electronic apparatus may include a liquid crystal display apparatus ("LCD"), an organic light-emitting display apparatus ("OLED"), or an inorganic light-emitting display apparatus.

For example, when the electronic apparatus further includes liquid crystal, the electronic apparatus may be the liquid crystal display apparatus (LCD). In this embodiment, the light-emitting device may serve as a light source, and the film may be included outside the light-emitting device and the liquid crystal to serve as a color conversion member.

In an embodiment, in a case where the interlayer of the light-emitting device includes an emission layer, and the emission layer includes an organic material, the electronic apparatus may be an organic light-emitting display apparatus. In this embodiment, the light-emitting device may serve as a light source, and the film may be included outside the light-emitting device to serve as a color conversion member.

In an embodiment, in a case where the interlayer of the light-emitting device includes an emission layer, and the emission layer includes an inorganic material, e.g., the film, the electronic apparatus may be an inorganic light-emitting display apparatus. In this embodiment, the light-emitting device may serve as a light source, and the film may be included outside the light-emitting device to serve as a color conversion member.

The electronic apparatus may further include a thin-film transistor (not shown) in addition to the light-emitting device as described above. The thin-film transistor may include a source electrode, a drain electrode, and an active layer, where one of the source electrode and the drain electrode may be electrically connected to one of the first electrode and the second electrode of the light-emitting device.

The thin-film transistor may further include a gate electrode, a gate insulating film, or the like.

The active layer may include a crystalline silicon, an amorphous silicon, an organic semiconductor, and an oxide semiconductor.

The electronic apparatus may further include an encapsulation unit for sealing the light-emitting device. The encapsulation unit may allow light to pass to the outside from the light-emitting device and prevent air and moisture permeating into the light-emitting device at the same time. The encapsulation unit may be a sealing substrate including transparent glass or a plastic substrate. The encapsulation unit may be a thin-film encapsulating layer including at least one of an organic layer and/or an inorganic layer. When the encapsulation unit is a thin-film encapsulating layer, the electronic apparatus may be flexible.

Various functional layers may be disposed on the encapsulation unit depending on the use of an electronic apparatus. Examples of the functional layer include the color filter, a color conversion layer, a touch screen layer, and a polarizing layer. The touch screen layer may be a resistive touch screen layer, a capacitive touch screen layer, or an infrared beam touch screen layer.

Description of FIG. 1

Hereinafter, the electronic apparatus 3 according to an embodiment will be described in detail with reference to FIG. 1.

The electronic apparatus 3 includes a light-emitting device 320 and a first substrate 340.

A film may be included outside the light-emitting device 320 (i.e., on a first electrode and/or a second electrode). In detail, the film may be included in the first substrate 340 located outside the light-emitting device 320. The first substrate 340 may function as a color conversion member, and the light-emitting device 320 may function as a light source.

The light-emitting device 320 may include a first electrode 321, a second electrode 323, and an interlayer 322 located between the first electrode 321 and the second electrode 323.

The electronic apparatus 3 may be an organic light-emitting display apparatus. Accordingly, the light-emitting device 320 may include an organic emission layer in the interlayer 322.

A pixel-defining layer 330 may be located on the first electrode 321. The pixel-defining layer 330 exposes a region of the first electrode 321, and an interlayer 322 may be arranged in the exposed region thereof.

According to an embodiment, one region 341 of the first substrate 340 may include the film. In this case, the first substrate 340 may be positioned in a direction in which light emitted from the light-emitting device 320 travels. That is, the film may be located outside the light-emitting device 320 and in the direction in which light emitted from the light-emitting device 320 travels.

The film may absorb first color light to emit second color light. Accordingly, the first substrate 340 may be designed to absorb the first color light and emit the second color light selected from a wide color range.

In an embodiment, the first substrate 340 may further include a scatterer.

According to an embodiment, the first substrate 340 may include a plurality of sub-pixel areas that may be spaced apart from each other. The first substrate 340 may include: a first area for emitting first color light; a second area for emitting second color light; and/or a third area for emitting third color light, which correspond to a plurality of the subpixel areas, respectively, and the first color light, the second color light, and/or the third color light may have different maximum emission wavelengths. In some embodiments, the first color light may be red light, the second color light may be green light, and the third color light may be blue light. At least one of the first area to third area may correspond to the one region 341. Among the first to third areas, the remainder that does not correspond to the one region 341 is another region (not shown). The other region may not include the film, and the other region may transmit light from a light-emitting device (not shown).

In an embodiment, the first region may include red quantum dots, the second region may include green quantum dots, and the third region may not include quantum dots. The first area, the second area, and/or the third area may each further include an emitter. In this embodiment, the third area may transmit light from the light-emitting device.

In some embodiments, the light-emitting device may emit first light, the first area may absorb the first light to emit 1-1 color light, the second area may absorb the first light to emit 2-1 color light, and the third area may absorb the first light to emit 3-1 color light. In this embodiment, the 1-1 color light, the 2-1 color light, and the 3-1 color light may each have a different maximum emission wavelength. In some embodiments, the first light may be blue light, the 1-1 color light may be red light, the 2-1 color light may be green light, and the 3-1 light may be blue light.

According to an embodiment, in the first substrate 340, a light blocking pattern 344 may be further disposed between the one region 341 and the other region.

In an embodiment, the electronic apparatus 3 may further include a second substrate 310.

The TFT may be disposed on the buffer layer 210 on the second substrate 310. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor and may include a source region, a drain region, and a channel region.

A gate insulating film 230 may be disposed on the active layer 220 to insulate the active layer 220 from the gate electrode 240, and the gate electrode 240 may be disposed on the gate insulating film 230.

An interlayer insulating film 250 may be disposed on the gate electrode 240. The interlayer insulating film 250 may be disposed between the gate electrode 240 and the source electrode 260 and between the gate electrode 240 and the drain electrode 270, thereby serving to insulate the gate electrode 240 from the source electrode 260 and insulate the gate electrode 240 from the drain electrode 270.

The source electrode 260 and the drain electrode 270 may be disposed on the interlayer insulating film 250. The interlayer insulating film 250 and the gate insulating film 230 may be formed to expose the source and drain regions of the active layer 220, and the source electrode 260 and the drain electrode 270 may be disposed in contact with the exposed source and drain regions of the active layer 220.

The TFT may be electrically connected to the light-emitting device to drive the light-emitting device and may be covered and protected by a passivation layer 280. The passivation layer 280 may include an inorganic insulating layer, an organic insulating layer, or a combination thereof. The light-emitting device is provided on the passivation layer 280.

The first electrode 321 may be disposed on the passivation layer 280. The passivation layer 280 may be disposed to expose a certain region of the drain electrode 270 without covering the entirety of the drain electrode 270, and the first electrode 321 may be disposed to be connected to the exposed certain region of the drain electrode 270.

Figure 2:
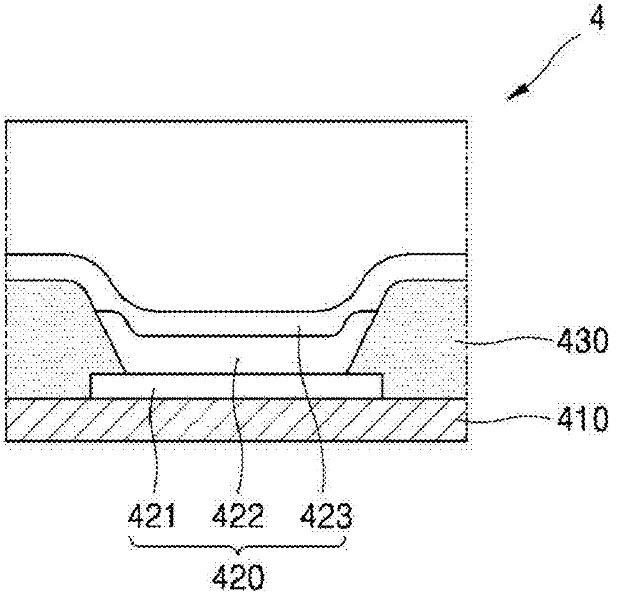
FIG. 2 is a schematic view of a light-emitting apparatus according to another embodiment.

Description of FIG. 2

Hereinafter, the electronic apparatus 4 according to an embodiment will be described in detail with reference to FIG. 2.

The electronic apparatus 4 includes a first substrate 410 and a light-emitting device 420.

The light-emitting device 420 may include a first electrode 421, a second electrode 423, and an interlayer 422 located between the first electrode 421 and the second electrode 423.

The film may be included in the interlayer 422, specifically, in the emission layer included in the interlayer 422.

When an electric field is applied between the first electrode 421 and the second electrode 423, the film may emit visible light. Accordingly, the light-emitting device 420 may be designed to emit a wide color range of wavelengths.

The interlayer 422 may further include an auxiliary layer between the emission layer and the first electrode and/or between the emission layer and the second electrode. The auxiliary layer may directly come in contact with the emission layer. The auxiliary layer may improve thin film characteristics of the emission layer.

The interlayer 422 may further include a first charge transport region between the emission layer and the first electrode and/or a second charge transport region between the emission layer and the second electrode.

Figure 3:
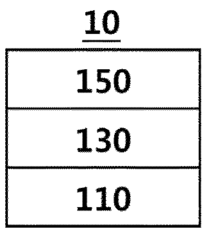
FIG. 3 is a schematic view of a light-emitting device according to an embodiment.

Description of FIG. 3

FIG. 3 is a schematic cross-sectional view of the light-emitting device described above. The light-emitting device 10 may include a first electrode 110, an interlayer 130, and a second electrode 150.

Hereinafter, a structure and a manufacturing method of the light-emitting device 10 will be described with reference to FIG. 3.

First Electrode 110

In FIG. 3, a substrate may be additionally located under the first electrode 110 or above the second electrode 150.

The first electrode 110 may be formed by depositing or sputtering, on the substrate, a material for forming the first electrode 110. When the first electrode 110 is an anode, a high work function material that may easily inject holes may be used as a material for a first electrode.

Interlayer 130

The interlayer 130 may be on the first electrode 110. The interlayer 130 may include an emission layer.

The interlayer 130 refers to a single layer and/or a plurality of layers located between the first electrode 110 and the second electrode 150 in the light-emitting device 10. The material included in the interlayer 130 may be an organic material and/or an inorganic material.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and the like, in addition to various organic materials.

The interlayer 130 may include: i) at least two emitting units sequentially stacked between the first electrode 110 and the second electrode 150; and ii) a charge generation layer located between the at least two emitting units. When the interlayer 130 includes the at least two emitting units and a charge generation layer, the light-emitting device 10 may be a tandem light-emitting device.

Hole Transport Region in Interlayer 130

The hole transport region may have i) a single-layered structure consisting of a single layer consisting of a single material, ii) a single-layered structure consisting of a single layer including a plurality of different materials, or iii) a multi-layered structure having a plurality of layers including a plurality of different materials.

The hole transport region may include a hole injection layer, a hole transport layer, an emission auxiliary layer, an electron blocking layer, or a combination thereof.

For example, the hole transport region may have a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked on the first electrode 110 in each stated order.

The thickness of the hole transport region may be in a range of about 50 (Angstroms) Å to about 10,000 Å, and in some embodiments, about 100 Å to about 4,000 Å. When the hole transport region includes a hole injection layer, a hole transport layer, or a combination thereof, the thickness of the hole injection layer may be in a range of about 100 Å to about 9,000 Å, and in some embodiments, about 100 Å to about 1,000 Å, and the thickness of the hole transport layer may be in a range of about 50 Å to about 2,000 Å, and in some embodiments, about 100 Å to about 1,500 Å. When the thicknesses of the hole transport region, the hole injection layer, and the hole transport layer are within any of these ranges, excellent hole transport characteristics may be obtained without a substantial increase in driving voltage.

Emission Layer in Interlayer 130

When the light-emitting device 10 is a full color light-emitting device, the emission layer may include emission layers for emitting different colors according to individual sub-pixels.

In some embodiments, the emission layer may be patterned into a first color emission layer, a second color emission layer, and a third color emission layer, according to a sub-pixel.

According to an embodiment, at least one of the emission layers may include a film formed using the ink composition. In some embodiments, the first color emission layer may be an inorganic emission layer including a quantum dot, and the second color emission layer and the third color emission layer may be organic emission layers each including different organic compounds. In this embodiment, the first color to the third color may be different from one another, and in some embodiments, the first color to the third color may each have different maximum emission wavelengths. The first color to the third color may be combined to be white light.

In some embodiments, the first color emission layer, the second color emission layer, and the third color emission layer may each be an organic emission layer including an organic compound.

In some embodiments, the emission layer may further include a fourth color emission layer, at least one emission layer of the first color to the fourth color emission layers may be an inorganic dot emission layer including a quantum dot, and the other emission layers may be organic emission layers each including organic compounds. Such a variation may be made. In this embodiment, the first color to the fourth color may be different from one another, and in some embodiments, the first color to the fourth color may each have different maximum emission wavelengths. The first color to the fourth color may be combined to be white light.

In one or more embodiments, the light-emitting device may have a stacked structure in which two or more emission layers for emitting light of identical or different colors contact each other or are separated from each other. At least one emission layer of the at least two emission layers may be an inorganic emission layer including the quantum dots, and the other emission layer may be an organic emission layer including organic compounds. Such a variation may be made. In detail, the light-emitting device includes a first color emission layer and a second color emission layer, and the first color and the second color may be the same color or different colors. More specifically, when the first color and the second color are the same, the first color and the second color may each be blue. In an embodiment, in a case where the first color and the second color are different from each other, the first color and the second color may be combined into white. In some embodiments, when the first color and the second color are different colors, the first color may be blue, and the second color may be green or red.

When the emission layer is an organic emission layer, the emission layer may include a host and a dopant. The dopant may be a phosphorescent dopant, a fluorescent dopant, a delayed fluorescent dopant, or a combination thereof.

The amount of the host in the emission layer may be greater than the amount of the dopant in the emission layer. In some embodiments, the amount of the dopant in the emission layer may be in a range of about 0.01 parts to about 15 parts by weight based on 100 parts by weight of the host.

In some embodiments, when the emission layer is an inorganic emission layer, the emission layer may include quantum dots. Specifically, the ink composition may include a film formed using the ink composition.

The emission layer may include a delayed fluorescence material. The delayed fluorescence material may act as a host or a dopant in an emission layer, and depending on the purpose of use, may be a delayed fluorescence host or a delayed fluorescence dopant.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

Electron Transport Region in Interlayer 130

The electron transport region may have i) a single-layered structure consisting of a single layer consisting of a single material, ii) a single-layered structure consisting of a single layer including a plurality of different materials, or iii) a multi-layered structure having a plurality of layers including a plurality of different materials.

The electron transport region may include a buffer layer, a hole blocking layer, an electron control layer, an electron transport layer, or an electron injection layer.

In some embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure are sequentially stacked on the emission layer in each stated order.

The thickness of the electron transport region may be in a range of about 160 Å to about 5,000 Å, and in some embodiments, about 100 Å to about 4,000 Å. When the electron transport region includes a buffer layer, a hole blocking layer, an electron control layer, an electron transport layer, or a combination thereof, the thicknesses of the buffer layer, the hole blocking layer, or the electron control layer may each independently be in a range of about 20 Å to about 1,000 Å, for example, about 30 Å to about 300 Å, and the thickness of the electron transport layer may be in a range of about 100 Å to about 1,000 Å Å, for example, about 150 Å to about 500 Å. When the thicknesses of the buffer layer, the hole blocking layer, the electron control layer, the electron transport layer, and/or the electron transport layer are each within these ranges, excellent electron transport characteristics may be obtained without a substantial increase in driving voltage.

Second Electrode 150

The second electrode 150 may be on the interlayer 130. In an embodiment, the second electrode 150 may be a cathode that is an electron injection electrode. In this embodiment, a material for forming the second electrode 150 may be a material having a low work function, for example, a metal, an alloy, an electrically conductive compound, or a combination thereof.

The second electrode 150 may have a single-layered structure, or a multi-layered structure including two or more layers.

Capping Layer

A first capping layer may be located outside the first electrode 110, and/or a second capping layer may be located outside the second electrode 150. In some embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

In the light-emitting device 10, light emitted from the emission layer in the interlayer 130 may pass through the first electrode 110 (which may be a semi-transmissive electrode or a transmissive electrode) and through the first capping layer to the outside. In the light-emitting device 10, light emitted from the emission layer in the interlayer 130 may pass through the second electrode 150 (which may be a semi-transmissive electrode or a transmissive electrode) and through the second capping layer to the outside.

The first capping layer and the second capping layer may improve the external luminescence efficiency based on the principle of constructive interference. Accordingly, the optical extraction efficiency of the light-emitting device 10 may be increased, thus improving the luminescence efficiency of the light-emitting device 10.

The first capping layer and the second capping layer may each include a material having a refractive index of 1.6 or higher (at 589 nm).

The first capping layer and the second capping layer may each independently be an organic capping layer including an organic material, an inorganic capping layer including an inorganic material, or an organic-inorganic composite capping layer including an organic material and an inorganic material.

Electronic Apparatus

The light-emitting device may be included in various electronic apparatuses. In an embodiment, the electronic apparatus including the light-emitting device may be a display apparatus, a light-emitting apparatus, an authentication apparatus, or the like.

The electronic apparatus (e.g., a light-emitting apparatus) may further include, in addition to the light-emitting device, i) a color filter, ii) a color conversion layer, or iii) a color filter and a color conversion layer. The color filter and/or the color conversion layer may be disposed on at least one traveling direction of light emitted from the light-emitting device. For example, light emitted from the light-emitting device may be blue light or white light. The light-emitting device may be understood by referring to the descriptions provided herein. In an embodiment, the color conversion layer may include quantum dots, and the color conversion layer may be a film formed by ink composition as described herein.

The electronic apparatus may include a first substrate. The first substrate may include a plurality of sub-pixel areas, the color filter may include a plurality of color filter areas respectively corresponding to the plurality of sub-pixel areas, and the color conversion layer may include a plurality of color conversion areas respectively corresponding to the plurality of sub-pixel areas.

A pixel-defining film may be located between the plurality of sub-pixel areas to define each sub-pixel area.

The color filter may further include a plurality of color filter areas and light-blocking patterns between the plurality of color filter areas, and the color conversion layer may further include a plurality of color conversion areas and light-blocking patterns between the plurality of color conversion areas.

The electronic apparatus may further include a thin-film transistor, in addition to the light-emitting device. The thin-film transistor may include a source electrode, a drain electrode, and an active layer, wherein one of the source electrode and the drain electrode may be electrically connected to one of the first electrode and the second electrode of the light-emitting device.

The thin-film transistor may further include a gate electrode, a gate insulating film, or the like.

The active layer may include a crystalline silicon, an amorphous silicon, an organic semiconductor, and an oxide semiconductor.

The electronic apparatus may further include an encapsulation unit for sealing the light-emitting device. The encapsulation unit may be located between the color filter and/or the color conversion layer and the light-emitting device. The encapsulation unit may allow light to pass to the outside from the light-emitting device and prevent the air and moisture to permeate to the light-emitting device at the same time. The encapsulation unit may be a sealing substrate including transparent glass or a plastic substrate. The encapsulation unit may be a thin-film encapsulating layer including at least one of an organic layer and/or an inorganic layer. When the encapsulation unit is a thin-film encapsulating layer, the electronic apparatus may be flexible.

In addition to the color filter and/or the color conversion layer, various functional layers may be disposed on the encapsulation unit depending on the use of an electronic apparatus. Examples of the functional layer may include a touch screen layer, a polarizing layer, or the like. The touch screen layer may be a resistive touch screen layer, a capacitive touch screen layer, or an infrared beam touch screen layer. The authentication apparatus may be, for example, a biometric authentication apparatus that identifies an individual according to biometric information (e.g., a fingertip, a pupil, or the like).

The authentication apparatus may further include a biometric information collecting unit, in addition to the light-emitting device described above.

The electronic apparatus may be applicable to various displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, or an endoscope display device), a fish finder, various measurement devices, gauges (e.g., gauges of an automobile, an airplane, or a ship), and a projector.

Manufacturing Method

The layers constituting the hole transport region, the emission layer, and the layers constituting the electron transport region may be formed in a specific region by using one or more suitable methods such as vacuum deposition, spin coating, casting, Langmuir-Blodgett ("LB") deposition, ink-jet printing, laser printing, and laser-induced thermal imaging.

When the layers constituting the hole transport region, the emission layer, and the layers constituting the electron transport region are each formed by vacuum deposition, the vacuum deposition may be performed at a deposition temperature in a range of about 100° C. to about 500° C. at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

EXAMPLE

Preparation Example 1: Manufacture of Quantum Dots Including Ligand on a Surface The InP/ZnSe/ZnS quantum dot dispersion solution prepared according to Chem.Mater. 2017, 29, 6893-6899 Part 2.2 was centrifuged 2 times by using acetone and ethanol, and vacuum-dried, thereby obtaining InP/ZnSe/ZnS quantum dot powder including an oleic acid ligand on a surface thereof.

Figure 4:
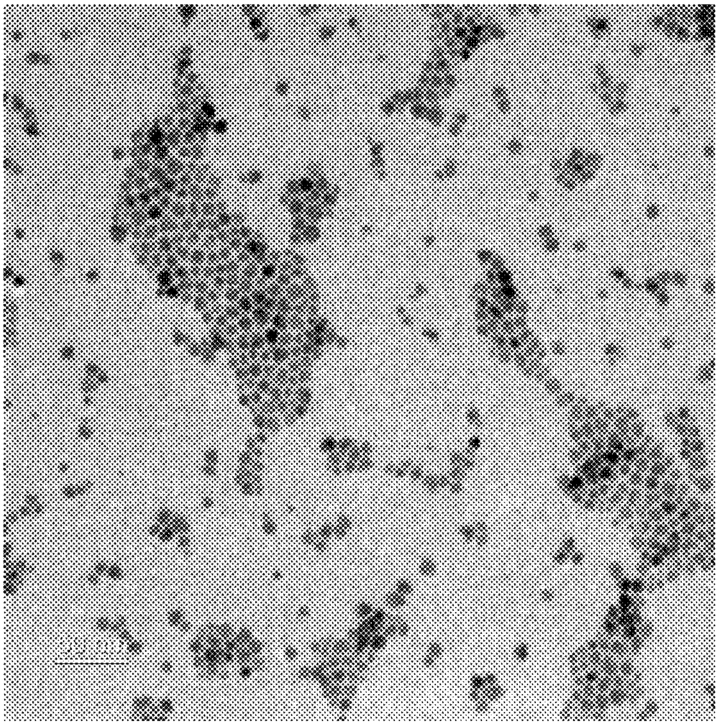
FIG. 4 is a scanning electron microscope ("SEM") image of quantum dots obtained in Preparation Example 1.

100 grams (g) of the quantum dot powder was dissolved in 125 g of toluene and 125 g of hexane, and 30 g of methoxytetraethylene glycol propionate was added thereto as a ligand including a polar moiety. Then, under a nitrogen atmosphere, the temperature was raised to 80° C. and maintained for 15 hours of reaction. Thus, quantum dots including a ligand on a surface was prepared. After adding hexane to the quantum dots containing the ligand on the surface, centrifugation was performed to precipitate and purify, and after redispersing in acetone, an excess of hexane was added again to precipitate for purification and drying. An electron microscope image of quantum dots including the ligand on the surface is shown in FIG. 4.

Preparation Example 2: Preparation of Scatterer Dispersion

As light scattering particles, titanium dioxide pigment particles were put into an oxetane group-containing compound (OXT-221 manufactured by TOAGOSEI) together with a modified polyurethane-based BASF EFKA dispersant and mixed to prepare a titanium dioxide dispersion. Here, the titanium dioxide pigment particles have an average particle diameter (D50) of 170 nm. 50 parts by weight of the titanium dioxide pigment, 5 parts by weight of the EFKA dispersant, and 45 parts by weight of OXT-221 were placed in a bead mill and stirred for 4 hours to prepare a titanium dioxide dispersion.

Preparation Example 3: Preparation of Polyfunctional Allyl Tertiary Amine Compound 1

Into a 250 milliliters (mL) three-necked round-bottom flask, 150 mL of a saturated KOH solution was added, and 8.0 g of ethylene diamine, 0.15 g of KI, and 0.15 g of $(Bu)_4NBr$ were added. 52.77 g of allyl bromide was added dropwise thereto, and the reaction mixture was heated at 65° C. for 48 hours. After that, the reaction mixture was extracted 4 times with ether (4×50 mL), and then the extract was washed with saturated NaCl solution. Then, the extract was dried over anhydrous $Na_2SO_4$, the solvent was evaporated, and the obtained product was purified by column chromatography using hexane:ethylacetate 9:1 (volumetric ratio) to thereby obtain N,N,N',N'-tetraallylethane-1,2-diamine.

Preparation Example 4: Preparation of Polyfunctional Allyl Tertiary Amine Compound 2

N-[2-(diallylamino)ethyl]-N, N',N'-triallylethane-1,2-diamine was obtained in the same manner as in Preparation Example 3, except that 9.0 g of diethylene triamine was used instead of 8.0 g of ethylene diamine as the amine compound.

Examples 1 to 4: Preparation of Ink Composition for Color Conversion Layer

The InP/ZnSe/ZnS quantum dots surface-modified with methoxytetraethylene glycol propionate prepared in Preparation Example 1 and a polyfunctional thiol compound, the polyfunctional allyl tertiary amine compound prepared in Preparation Example 3 or 4, an epoxy compound, an oxetane compound, a polymerization initiator, a scatterer dispersion of Preparation Example 2, and other ingredients were mixed together to prepare an ink composition. Table 1 shows the specific compounds and contents (parts by weight) used in Examples 1 to 4. Table 2 shows the names of the specific compounds indicated by symbols in Table 1. In each of the compositions of Examples 1 to 4 and Comparative Examples 1 to 4, as other ingredients, 2 parts by weight of surfactant G1, 0.5 parts by weight of adhesion enhancer H1, 0.5 parts by weight of sensitizer I1, and 0.5 parts by weight of stabilizer J1 were used. The parentheses in Table 1 indicate parts by weight of each ingredient for the total 100 parts by weight of the ink composition.

TABLE 1

| | Quantum dot | Thiol compound | Amine compound | Epoxy compound | Oxetane compound | Polymerization initiator | Scatterer dispersion |
|---|---|---|---|---|---|---|---|
| Example 1 | A1 (35) | B1(15) | C1(15) | D1 (5)<br>D2 (10) | D3 (15) | E1(1) | — |
| Example 2 | A1 (35) | B1(13) | C1(13) | D1 (5)<br>D2 (10) | D3 (11) | E1(1) | F1 (8) |
| Example 3 | A1 (35) | B1(12)<br>B2(3) | C1(15) | D1 (5)<br>D2 (10) | D3 (19) | E1(1) | — |
| Example 4 | A1 (35) | B1(13) | C2(15) | D1 (5)<br>D2 (10) | D3 (15) | E1(1) | — |
| Comparative Example 1 | AX (35) | B1(15) | C1(15) | D1 (5)<br>D2 (10) | D3 (19) | E1(1) | — |
| Comparative Example 2 | A1 (35) | — | — | D1 (10)<br>D2 (24) | D3 (24) | E2(3) | — |
| Comparative Example 3 | A1 (35) | B1(15) | C3(15) | D1 (5)<br>D2 (10) | D3 (15) | E1(1) | — |
| Comparative Example 4 | A1 (35) | B1(23)<br>B2(3) | C1(26) | — | — | E1(1) | F1 (8) |

TABLE 2

| | |
|---|---|
| A1 | Quantum dots surface-modified as in Preparation Example 1 (InP/ZnSe/ZnS quantum dots having methoxytetraethylene glycol propionate ligands) |
| AX | Quantum dots not surface-modified as in Preparation Example 1 (InP/ZnSe/ZnS quantum dots having lauric acid ligands) |

TABLE 2-continued

| | |
|---|---|
| B1 | 1,4-bis(3-mercaptobutyryloxy)butyrate (Showa Denko) |
| B2 | Pentaerythritol tetrakis(3-mercaptobutyrate) (Showa Denko) |
| C1 | N,N,N',N'-tetraallylethane-1,2-diamine (Preparation Example 3) |
| C2 | N, N'-1,4-diallylpiperazine |
| C3 | Diallyl phthalate |
| D1 | Celloxide 2021P (Daicell) |
| D2 | Neopentylglycol diglycidylether (Kukdo Chemical) |
| D3 | OXT-221 (Toagosei) |
| E1 | OMNIRAD 651 (IGM Resin) |
| E2 | OMNICAT 270 (IGM Resin) |
| F1 | Titanium dioxide dispersion prepared as in Preparation Example 2 |
| G1 | MEGAFACE F-552 (DIC) |
| H1 | KBM-403 (Shin Etsu) |
| I1 | 9,10-dimethoxy anthracene (Merck) |
| J1 | 2,6-di-t-butyl-4-methylphenol (Merck) |

Evaluation Example 1: Viscosity Measurement of Composition

For the ink composition prepared in Examples 1 to 4 and Comparative Examples 1 to 4, the viscosity was measured at room temperature (25° C.) using a viscometer (Brookfield DV-II, RV-2 spindle).

Evaluation Example 2: Evaluation of Light Conversion Rate and Light Absorption Rate of Quantum Dots The ink compositions prepared in Examples 1 to 4 and Comparative Examples 1 to 4 were spin-coated to a thickness of 10 μm on each glass substrate having a width and a length of 50 millimeters (mm) and a thickness of 0.5 mm. After a film was formed by curing by irradiating ultraviolet rays with a wavelength of 395 nm in atmosphere, the glass substrate was cut such that the central portion of the film was 20 mm in width and length each.

For the film, the blue light conversion rate was measured using an integral hemispherical type measuring instrument (QE-2100, Otsuka). For this purpose, blue light of 450 nm to 460 nm was applied to the film, and the amount (A) of the applied blue light was measured, and the amount (A') of blue light after passing through the film and the amount of green light (B) captured in all directions of emission were calculated as an integral value. The light conversion rate (green/blue) from blue light to green light was obtained by Equation (1), and the light absorption rate of blue light was obtained by Equation (2):

$$\text{Light conversion rate (green/blue)}=B/(A-A')\times 100 \quad (1)$$

$$\text{Light absorption rate}=(A-A')/A\times 100 \quad (2)$$

When the light conversion rate (green/blue) was 25% or more, the case was denoted by O, and when the light conversion rate was less than 25%, the case was denoted by X. When the light absorption rate was 70% or more, the case was denoted by O, and when the light absorption rate was less than 70%, the case was denoted by X.

Evaluation Example 3: Evaluation of Damage During Flexion

After the polyester film was taped on a glass substrate, the curable composition prepared in Examples 1 to 4 and Comparative Examples 1 to 4 were spin-coated on a polyester film to a thickness of 10 μm. After curing by irradiating ultraviolet rays with a wavelength of 395 nm in atmosphere to form a coating film, the polyester film was peeled off from the glass substrate.

A sample was prepared by cutting the film on which the coating film was formed to a size of 20 mm×100 mm. The sample was installed in a U-shaped bending tester such that the coated side of the coating film went inward, and the bending radius was set to 2 mm, and the coating film was bent 100,000 times at a rate of 1 time/sec. Each film after the bending test was observed with a naked eye whether the coating film of the curved part was damaged. When no damage was observed during bending, the case was denoted as O, and when damage such as cracks was observed, the case was denoted as X.

Evaluation Example 4: Visibility of the Crease

The folded surface of the sample after the bending test of Evaluation Example 3 was visually observed. In case of viewing the sample from the front, when the folded part was not visually recognized, the case was denoted by O, when the folded part was weakly visible, the case was denoted by Δ, and when the folded part was clearly visible, the case was denoted by X.

Table 3 shows the results of measuring the viscosity, light conversion rate, light absorption rate, damage during bending, and the degree of visibility of the folded part of Examples 1 to 4 and Comparative Examples 1 to 4.

TABLE 3

| | Viscosity (cP) | Light conversion rate | Light absorption rate | During bending No damage | Folded part Not recognized |
|---|---|---|---|---|---|
| Example 1 | 33.6 | ○ | ○ | ○ | Δ |
| Example 2 | 35.2 | ○ | ○ | ○ | Δ |
| Example 3 | 65.4 | ○ | ○ | ○ | Δ |
| Example 4 | 32.2 | ○ | ○ | ○ | ○ |
| Comparative Example 1 | Impossible to evaluate physical properties of the composition due to the poor dispersion state of quantum dot particles. | | | | |
| Comparative Example 2 | 35.9 | ○ | ○ | X | O |
| Comparative Example 3 | 32.1 | Impossible to evaluate physical properties due to poor curing of the coating film | | | |
| Comparative Example 4 | 61.5 | ○ | ○ | ○ | X |

Referring to the results of Table 3, the light conversion rates from blue to green of the film formed by using the Examples 1 to 4 and Comparative Examples 1 to 4 were 30% or more, and the light absorption rates were 90% or more, however, it is seen that the degree of damage and folded part visibility of the film formed by the compositions of Examples 1 to 4 were superior to those of the film formed by the compositions of Comparative Examples 1 to 4.

By using the ink composition according to the embodiments of the disclosure, it is possible to provide a quantum dot film with no damage due to bending, and having a low degree of visibility of the folded part and an electronic apparatus including the quantum dot film.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An ink composition comprising:

a quantum dot comprising at least one organic ligand on a surface thereof;

a first monomer comprising at least one epoxy group;

a second monomer comprising at least one oxetane group;

a third monomer comprising at least one thiol group; and a tertiary amine compound comprising at least one allylamine group, wherein the organic ligand comprises at least one polar moiety.

2. The ink composition of claim 1, wherein the third monomer comprises a compound having a plurality of thiol groups.

3. The ink composition of claim 1, wherein the third monomer comprises a compound comprising one thiol group and a compound comprising a plurality of thiol groups.

4. The ink composition of claim 1, wherein the third monomer is represented by Formula 3-1 or Formula 3-2:

Formula 3-1

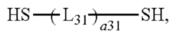

Formula 3-2

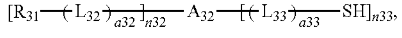

wherein, in Formulae 3-1 and 3-2, $L_{31}$ is a linear or branched $C_1$-$C_{20}$ alkane group, a linear or branched $C_1$-$C_{20}$ alkene group, or a $C_6$-$C_{20}$ arene group, $L_{32}$ and $L_{33}$ are each a single bond,

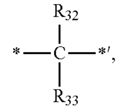

*—O—*', or

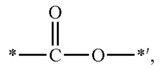

$A_{32}$ is

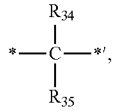

*—S—*', a $C_3$-$C_{20}$ heteroarene group, or

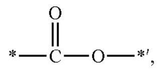

a31 to a33 are each independently 1, 2, 3, 4, 5, 6, 7, 8, 9, or 10, $R_{31}$ to $R_{35}$ are each independently hydrogen, deuterium, a halogen element, or a linear, branched, or cyclic $C_1$-$C_{20}$ alkyl group, n32 and n33 are each independently 0, 1, 2, 3, 4, or 5, the sum of n32 and n33 is 1 or greater, and

* and *' each indicate a binding site to an adjacent atom.

5. The ink composition of claim 1, wherein the tertiary amine compound comprises a compound comprising a plurality of allylamine groups.

6. The ink composition of claim 1, wherein the tertiary amine compound comprises a compound comprising one allylamine group and a compound comprising a plurality of allyl groups.

7. The ink composition of claim 1, wherein the tertiary amine compound is represented by Formula 4-1 or Formula 4-2:

Formula 4-1

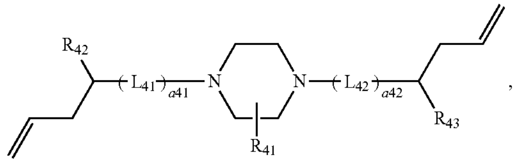

-continued

Formula 4-2

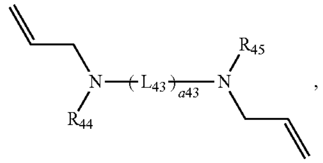

wherein, in Formulae 4-1 and 4-2, $L_{41}$, $L_{42}$, and $L_{43}$ are each independently a direct bond,

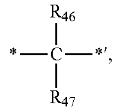 or 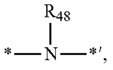

a41 and a42 are each independently 0, 1, 2, 3, 4, or 5, a43 is 1, 2, 3, 4, or 5, $R_{41}$ to $R_{48}$ are each independently hydrogen, deuterium, a halogen element, $—CH_2—CH═CH_2$, or a substituted or unsubstituted linear, branched, or cyclic $C_1$-$C_{20}$ alkyl group, a substituent of the linear, branched, or cyclic $C_1$-$C_{20}$ alkyl group comprises deuterium, a halogen element, or $—N(CH_2—CH═CH_2)_2$, and

* and *' each indicate a binding site to an adjacent atom.

8. The ink composition of claim 1, wherein the quantum dot comprises: a group II-VI semiconductor compound; a group III-V semiconductor compound; a group III-VI semiconductor compound; a group semiconductor compound; a group IV-VI semiconductor compound; a group IV element or compound; or a combination thereof.

9. The ink composition of claim 1, wherein the quantum dot has a core-shell structure.

10. The ink composition of claim 1, wherein the at least one polar moiety of the organic ligand comprises an alkylpolyol structure.

11. The ink composition of claim 1, further comprising a photopolymerization initiator.

12. The ink composition of claim 1, wherein a viscosity of the ink composition is in a range of about 20 centipoise (cP) to about 80 cP at a temperature of 25° C.

13. The ink composition of claim 1, comprising 2 parts by weight of a solvent based on 100 parts by weight of the ink composition.

* * * * *